(12) United States Patent
Mayer et al.

(10) Patent No.: US 10,659,065 B2
(45) Date of Patent: May 19, 2020

(54) APPARATUS AND METHODS FOR PHASE SYNCHRONIZATION OF PHASE-LOCKED LOOPS

(71) Applicant: Analog Devices, Inc., Norwood, MA (US)

(72) Inventors: Christopher Mayer, Dover, MA (US); David J. McLaurin, Raleigh, NC (US); Christopher W. Angell, Cary, NC (US); Sudhir Desai, Mansfield, MA (US); Steven R. Bal, Cary, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/957,766

(22) Filed: Apr. 19, 2018

(65) Prior Publication Data

US 2018/0294817 A1  Oct. 11, 2018

Related U.S. Application Data

(63) Continuation of application No. 15/147,408, filed on May 5, 2016, now Pat. No. 9,979,408.

(51) Int. Cl.
*H03L 7/197* (2006.01)
*H03L 7/087* (2006.01)
(Continued)

(52) U.S. Cl.
CPC ............ *H03L 7/1976* (2013.01); *H03L 7/087* (2013.01); *H03L 7/0891* (2013.01); *H03L 7/091* (2013.01);
(Continued)

(58) Field of Classification Search
CPC . G06F 1/00; G06F 1/0328; G06F 7/00; G06F 7/68; H03B 28/00; H03K 4/00;
(Continued)

(56) References Cited

U.S. PATENT DOCUMENTS 5,675,291 A   10/1997  Sudjian
5,825,813 A   10/1998  Na
(Continued)

FOREIGN PATENT DOCUMENTS

CN   1380749 A   11/2002
CN   1464637 A   12/2003
(Continued)

OTHER PUBLICATIONS

Oct. 5, 2017 EP Office Action and Search Report from European Application No. 17167699.2 (counterpart to U.S. Appl. No. 15/147,408).
(Continued)

*Primary Examiner* — Lincoln D Donovan
*Assistant Examiner* — Dave Mattison
(74) *Attorney, Agent, or Firm* — Knobbe, Martens, Olson & Bear LLP

(57) ABSTRACT

Apparatus and methods for phase synchronization of phase-locked loops (PLLs) are provided. In certain configurations, an RF communication system includes a PLL that generates one or more output clock signals and a phase synchronization circuit that synchronizes a phase of the PLL. The phase synchronization circuit includes a sampling circuit that generates samples by sampling the one or more output clock signals based on timing of a reference clock signal. Additionally, the phase synchronization circuit includes a phase difference calculation circuit that generates a phase difference signal based on the samples and a tracking digital phase signal representing the phase of the PLL. The phase synchronization circuit further includes a phase adjustment control circuit that provides a phase adjustment to the PLL based on the phase difference signal so as to synchronize the PLL.

21 Claims, 12 Drawing Sheets

(51) Int. Cl.
*H03L 7/23* (2006.01)
*H03L 7/089* (2006.01)
*H03L 7/091* (2006.01)
*H03L 7/093* (2006.01)
*H04B 7/0413* (2017.01)
*H04L 7/033* (2006.01)

(52) U.S. Cl.
CPC ............ *H03L 7/093* (2013.01); *H03L 7/23* (2013.01); *H03L 7/235* (2013.01); *H04B 7/0413* (2013.01); *H04L 7/0331* (2013.01)

(58) Field of Classification Search
CPC .......... H03K 4/026; H03L 7/00; H03L 7/087; H03L 7/0891; H03L 7/091; H03L 7/093; H03L 7/1976; H03L 7/23; H03L 7/235; H04B 7/00; H04B 7/0413; H04L 7/00; H04L 7/0331; H04M 1/00; H04M 1/505
USPC ........................................................ 327/107
See application file for complete search history.

(56) References Cited

U.S. PATENT DOCUMENTS

| | | | |
|---|---|---|---|
| 6,028,905 A | 2/2000 | Gaines | |
| 6,456,164 B1 | 9/2002 | Fan | |
| 6,463,266 B1 | 10/2002 | Shohara | |
| 6,516,184 B1 | 2/2003 | Damgaard | |
| 6,556,086 B2 | 4/2003 | Keaveney et al. | |
| 6,710,951 B1 | 3/2004 | Cloke | |
| 6,845,126 B2 | 1/2005 | Dent | |
| 7,155,180 B2 | 12/2006 | Kim | |
| 7,312,663 B2 | 12/2007 | Abel | |
| 7,317,360 B2 | 1/2008 | Keaveney | |
| 7,319,724 B2 | 1/2008 | Kishi | |
| 7,362,826 B2 | 4/2008 | Willingham | |
| 7,394,885 B2 | 7/2008 | Giunco et al. | |
| 7,398,056 B1 | 7/2008 | Ebert | |
| 7,463,710 B2 | 12/2008 | Walsh et al. | |
| 7,466,785 B2 | 12/2008 | Sanduleanu | |
| 7,606,341 B2 | 10/2009 | Pereira | |
| 7,672,364 B2 | 3/2010 | Kang | |
| 7,733,949 B2 | 6/2010 | Jin | |
| 7,734,000 B2 | 6/2010 | Kuo | |
| 7,804,926 B2 | 9/2010 | Sanduleanu | |
| 7,826,808 B2 | 11/2010 | Faulkner | |
| 7,936,222 B2 | 5/2011 | Wang | |
| 7,986,745 B2 | 7/2011 | Hosaka | |
| 8,063,707 B2 | 11/2011 | Wang | |
| 8,106,690 B2 | 1/2012 | Sakaguchi | |
| 8,121,233 B2 | 2/2012 | Chang | |
| 8,284,824 B1 | 10/2012 | Smaini | |
| 8,340,167 B2 | 12/2012 | Feng | |
| 8,358,729 B2 | 1/2013 | Bae | |
| 8,378,751 B2 | 2/2013 | Fagg | |
| 8,618,851 B2 | 12/2013 | Li | |
| 8,665,938 B2 | 3/2014 | Yu | |
| 8,755,751 B2 | 6/2014 | Brunel et al. | |
| 8,816,724 B2 | 8/2014 | Kennedy | |
| 8,890,624 B2 | 11/2014 | Chen et al. | |
| 8,897,735 B2 | 11/2014 | Kim | |
| 8,917,759 B2 | 12/2014 | Xu | |
| 8,958,504 B2 | 2/2015 | Warke | |
| 8,995,517 B2 | 3/2015 | Delforce | |
| 9,008,161 B1 | 4/2015 | Chang | |
| 9,048,847 B2 | 6/2015 | McLaurin et al. | |
| 9,065,459 B1 | 6/2015 | Buell | |
| 9,203,448 B2 | 12/2015 | Morita | |
| 9,300,444 B2 | 3/2016 | Hormis | |
| 9,325,553 B2 | 4/2016 | Kaukovuor | |
| 9,385,790 B1 | 7/2016 | Mukherjee | |
| 9,614,557 B1 | 4/2017 | Mayer et al. | |
| 9,673,847 B1 | 6/2017 | Mayer et al. | |
| 9,948,312 B2 | 4/2018 | Janardhanan et al. | |
| 9,979,408 B2 | 5/2018 | Mayer et al. | |
| 2003/0151455 A1 | 8/2003 | Kawai | |
| 2003/0153273 A1 | 8/2003 | Ebert | |
| 2003/0171110 A1 | 9/2003 | Shi | |
| 2003/0206603 A1 | 11/2003 | Husted | |
| 2005/0111605 A1 | 5/2005 | Loke et al. | |
| 2006/0034356 A1 | 2/2006 | Fechtel | |
| 2006/0035601 A1 | 2/2006 | Seo | |
| 2006/0141963 A1 | 6/2006 | Maxim et al. | |
| 2007/0077906 A1 | 4/2007 | Kirichenko | |
| 2007/0152762 A1 | 7/2007 | Hung et al. | |
| 2007/0247233 A1 | 10/2007 | Keaveney | |
| 2008/0008067 A1 | 1/2008 | Arisaka | |
| 2008/0280581 A1* | 11/2008 | Rofougaran | H01Q 1/2291 455/296 |
| 2009/0054007 A1 | 2/2009 | Kawabe et al. | |
| 2009/0146736 A1 | 6/2009 | Kim | |
| 2009/0184773 A1 | 7/2009 | Woo et al. | |
| 2009/0232195 A1 | 9/2009 | Ozawa | |
| 2010/0087227 A1 | 4/2010 | Francos | |
| 2010/0150289 A1 | 6/2010 | Sunaga | |
| 2010/0239057 A1* | 9/2010 | Chang | H03L 7/00 375/349 |
| 2011/0013724 A1 | 1/2011 | Metreaud | |
| 2011/0292978 A1 | 12/2011 | Kravitz | |
| 2012/0230176 A1 | 9/2012 | Komninakis | |
| 2012/0300818 A1 | 11/2012 | Metreaud | |
| 2013/0266045 A1 | 10/2013 | Lakkis | |
| 2013/0272175 A1 | 10/2013 | Zargari et al. | |
| 2014/0134943 A1 | 5/2014 | Hobbs | |
| 2014/0192923 A1 | 7/2014 | Matsuo | |
| 2015/0063517 A1* | 3/2015 | Verlinden | H04L 7/0079 375/376 |
| 2015/0084676 A1 | 3/2015 | McLaurin et al. | |
| 2015/0118980 A1 | 4/2015 | Leung et al. | |
| 2015/0222418 A1 | 8/2015 | Akita | |
| 2015/0311989 A1 | 10/2015 | Richmond | |
| 2016/0036451 A1 | 2/2016 | Kamali | |
| 2016/0043860 A1 | 2/2016 | Tu | |
| 2016/0087783 A1 | 3/2016 | Lin | |
| 2016/0087784 A1 | 3/2016 | Lin | |
| 2017/0134031 A1 | 5/2017 | Ezell et al. | |
| 2018/0294817 A1 | 10/2018 | Mayer et al. | |
| 2019/0346877 A1 | 11/2019 | Allan | |

FOREIGN PATENT DOCUMENTS

| | | |
|---|---|---|
| CN | 101150316 A | 3/2008 |
| CN | 101373951 A | 2/2009 |
| CN | 201887747 U | 6/2011 |
| CN | 102823161 A | 12/2012 |
| CN | 103986565 A | 8/2014 |
| CN | 104467834 A | 3/2015 |
| JP | 2012-49659 | 3/2012 |
| WO | WO 2005/002055 A2 | 1/2005 |

OTHER PUBLICATIONS

Synchronization and MIMO Capability with USRP Devices, Ettus Research, downloaded on Aug. 10, 2016 from World Wide Web page: ettus.com/content/files/kb/mimo_and_sync_with_usrp_updated.pdf, 10 pages.

Urbansky et al., "A Novel Slave-Clock Implementation Approach for Telecommunications Network Synchronisation," Proceedings of the European Frequency & Time Forum (1996) pp. 534-539.

Woo et al., "Fast-lock Hybrid PLL Combining Fractional- & Integer-N Modes of Differing Bandwidths" in 2 pages.

Application as filed in U.S. Appl. No. 15/977,171 dated May 11, 2018 in 36 pages.

Office Action received in TW Appln. No. 106114838, dated Dec. 6, 2018 (counterpart to U.S. Appl. No. 15/957,766).

Office Action received in CN Appln. No. 201710309958.2, dated Nov. 4, 2019 (counterpart to U.S. Appl. No. 15/957,766).

* cited by examiner

US 10,659,065 B2

APPARATUS AND METHODS FOR PHASE SYNCHRONIZATION OF PHASE-LOCKED LOOPS

CROSS-REFERENCE TO RELATED APPLICATIONS

This application is a continuation of U.S. patent application Ser. No. 15/147,408, filed May 5, 2016 and titled "APPARATUS AND METHODS FOR PHASE SYNCHRONIZATION OF PHASE-LOCKED LOOPS," which is herein incorporated by reference in its entirety.

BACKGROUND

Field

Embodiments of the invention relate to electronic systems, and more particularly, to phase synchronization of phase-locked loops.

Description of the Related Technology

Phase-locked loops (PLLs) can be used in a variety of applications for generating an output clock signal having a controlled phase and frequency relationship to a reference clock signal. PLLs can be used in, for example, telecommunication systems and/or chip-to-chip communication.

An integer-N PLL can be implemented by providing an integer frequency divider in the PLL's feedback loop. The integer-N PLL can be used to synthesize output frequencies in steps of a reference frequency by selecting an integer division value N of the frequency divider. For example, at steady state, the frequency of the PLL's output clock signal is controlled to be N times the reference clock signal's frequency. Thus, in an integer-N PLL, at steady state the output clock signal has N periods for every period of the reference clock signal.

To provide finer steps of output frequency adjustment, a fractional-N PLL can be used. In contrast to an integer-N PLL that uses integer division values, a fractional-N PLL permits fractional division values. At steady state, the frequency of the PLL's output clock signal is controlled to be N+F/M times the reference clock signal's frequency, where N is the integer portion of the division value and F/M is the fractional portion of the division value.

SUMMARY

In one aspect, a radio frequency (RF) communication system is provided. The RF communication system includes a phase-locked loop (PLL) configured to generate one or more output clock signals, a sampling circuit configured to generate a plurality of samples by sampling the one or more output clock signals based on timing of a reference clock signal, a phase difference calculation circuit configured to generate a phase difference signal based on the plurality of samples and a tracking digital phase signal representing the phase of the PLL, and a phase adjustment control circuit configured to provide a phase adjustment to the PLL based on the phase difference signal so as to synchronize the PLL.

In another aspect, a method of phase synchronization in a frequency synthesizer is provided. The method includes generating one or more output clock signals using a phase-locked loop (PLL), sampling the one or more output clock signals based on timing of a reference clock signal to generate a plurality of samples, generating a phase difference signal based on the plurality of samples and a tracking digital phase signal representing a phase of the PLL, and synchronizing the PLL by providing a phase adjustment that is based on the phase difference signal.

In another aspect, a massive multiple-input multiple-output (MIMO) system is provided. The massive MIMO system includes a plurality of frequency synthesizers configured to generate a plurality of local oscillator signals based on timing of a common reference clock signal. Additionally, a first frequency synthesizer of the plurality of frequency synthesizers includes a phase-locked loop (PLL) configured to generate one or more local oscillator signals of the plurality of local oscillator signals, a sampling circuit configured to generate a plurality of samples by sampling the one or more local oscillator signals based on timing of the common reference clock signal, a phase difference calculation circuit configured to generate a phase difference signal based on the plurality of samples and a tracking digital phase signal representing the phase of the PLL, and a phase adjustment control circuit configured to provide a phase adjustment to the PLL based on the phase difference signal.

DETAILED DESCRIPTION OF EMBODIMENTS

Figure 1A:
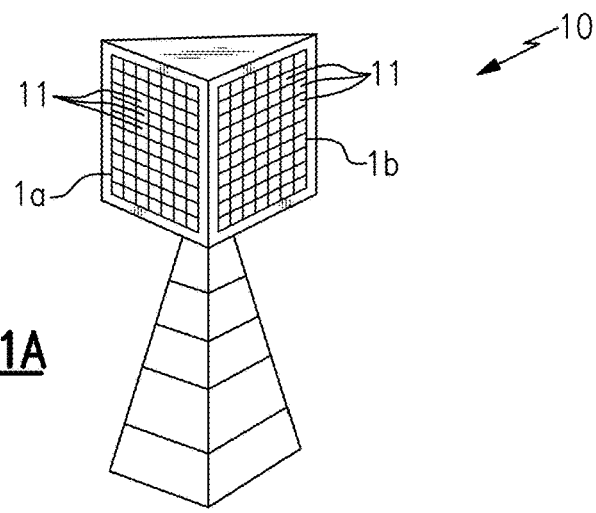
FIG. 1A is a schematic diagram of one embodiment of a massive multiple-input-multiple-output (MIMO) base station.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that certain embodiments can include more elements than illustrated in a drawing and/or a subset of the elements illustrated in a drawing. Further, some embodiments can incorporate any suitable combination of features from two or more drawings.

A radio frequency (RF) communication system can include a fractional-N phase-locked loop (PLL) to increase flexibility by providing relatively small output frequency steps over a wide range of reference clock frequencies. However, absent synchronization, the fractional-N PLL can lock unpredictably to one of a multitude of possible phases of a reference clock signal.

In certain RF communication systems, it can be desirable to synchronize the phase of a PLL's output clock signal to a known relationship with a reference clock signal. For example, in frequency hopping wireless communication systems, a local oscillator may maintain the same phase relationship with the reference clock signal each time the frequency of the local oscillator changes. Furthermore, in multi-PLL systems, it can be important to maintain the same phase relationship between the output clock signals generated by the PLLs.

It can be difficult to reliably measure input and output phases of a PLL. Although input phase information may be present in an accumulator of a sigma-delta modulator of the PLL, sigma-delta noise can make observation difficult, since the accumulator can be updated using a feedback clock signal of the PLL, rather than the reference clock signal. Additionally, the output of the PLL can be quantized, such as quantized to 1-bit, which can make observation of an instantaneous output phase likewise difficult.

Apparatus and methods for phase synchronization of PLLs are provided herein. In certain configurations, an RF communication system includes a PLL that generates one or more output clock signals and a phase synchronization circuit that synchronizes a phase of the PLL. The phase synchronization circuit includes a sampling circuit that generates samples by sampling the one or more output clock signals based on timing of a reference clock signal. Additionally, the phase synchronization circuit includes a phase difference calculation circuit that generates a phase difference signal based on the samples and a tracking digital phase signal representing the phase of the PLL. The phase synchronization circuit further includes a phase adjustment control circuit that provides a phase adjustment to the PLL based on the phase difference signal so as to synchronize the PLL.

In certain configurations herein, an output phase of a PLL is measured statistically and averaged over time to enhance accuracy. For example, the output clock signal(s) generated by the PLL can be sub-sampled into a clock domain of the reference clock signal. The sub-sampling can be performed in a variety of ways, such as by using high speed current mode logic (CML) sampling circuits. Additionally, the samples of the PLL's output clock signal(s) are provided to the phase difference calculation circuit, which generates a phase difference signal based on the samples and the tracking digital phase signal representing the phase of the PLL.

In certain implementations, a tracking phase accumulator generates the tracking digital phase signal representing the PLL's phase. The tracking phase accumulator can be clocked by the reference clock signal and can accumulate a fractional frequency tuning signal used to control the PLL's division rate. The phase difference between the tracking phase accumulator and the output phase information indicated by the samples can be observed over time by the phase difference calculation circuit to determine an amount of phase adjustment to apply to the PLL.

In certain implementations, the phase adjustment control circuit provides phase adjustment by adjusting a state of a modulator of the PLL. For example, a phase offset can be added to an accumulator of a sigma-delta modulator of the PLL, thereby shifting the PLL's output phase by a corresponding offset. Thus, the phase synchronization circuit can operate as a digital slow loop between an output of the PLL and an input to a sigma-delta modulator of the PLL. In certain implementations, the phase adjustment is added in parts over multiple reference clock cycles, thereby maintaining the PLL in lock without slipping cycles. However, the phase adjustment control circuit can provide phase adjustment in a wide variety of ways.

The PLL can generate output clock signals for a wide variety of applications. In one example, the PLL is used to generate an in-phase (I) local oscillator signal and a quadrature-phase (Q) local oscillator signal used for frequency up-conversion and/or down-conversion in a transceiver. Additionally, the I and Q local oscillator signals are sub-sampled using the PLL's reference clock signal to generate I and Q samples for the phase difference calculation circuit.

In certain implementations, the phase synchronization circuit adjusts the PLL's phase to track a master digital phase signal generated by a master phase control circuit. Thus, phase synchronization can be performed globally across multiple PLLs, including PLLs on different transceiver chips. Thus, the teachings herein can provide a digital slow loop system for a PLL that samples an output clock signal of the PLL and provides synchronization to match a master digital phase signal. Thus, phase can be digitally synchronized globally across multiple transceiver parts. The PLL can be synchronized both when operating using a fractional divisor and when operating using an integer divisor.

The teachings herein can be used to provide phase synchronization in massive multiple-input-multiple-output (MIMO) systems in which a relatively large number of parallel RF transceivers simultaneously process multiple RF frequency bands. In such configurations, 100 or more PLLs can be synchronized in accordance with the teachings herein, thereby facilitating implementation of massive MIMO systems communicating using hundreds of antennas.

In certain implementations, a PLL's frequency is modified during initial phase acquisition, such that the digital slow loop obtains samples of the PLL's output clock signal that are relatively uncorrelated, even when the PLL operates with an integer or near-integer division value. The frequency modification is provided within the PLL's bandwidth, such that the PLL maintains lock as the frequency is modified.

In certain implementations, the PLL generates an in-phase (I) local oscillator signal and a quadrature-phase (Q) local oscillator signal. Additionally, the I and Q local oscillator signals can be sampled by the sampling circuit to generate I and Q samples collectively representing a phase quadrant in which the local oscillator signal is present. A precision of the tracking phase accumulator can be implemented to match the PLL's fractional precision, such that a relatively accurate phase of the PLL can be extracted.

In one embodiment, the tracking digital phase signal is provided to a numerically controlled oscillator (NCO) that generates an I/Q vector including an I phase signal and a Q phase signal. Additionally, the phase difference between the I/Q vector generated by the NCO and an I/Q vector associated with the local oscillator samples can be measured to determine an amount of phase adjustment to apply to the PLL. For example, to determine the phase difference, the I/Q vector generated by the NCO can be cross-multiplied with the complex conjugate of the I/Q vector associated with the I and Q local oscillator samples, and the cross-multiplication products can be accumulated over time.

In certain implementations, the I and Q samples of the local oscillator signal are 1-bit, and a 1-bit resolution is employed for the NCO used to generate the I/Q vector. Accordingly, the cross-multiplications can be computed using combinational logic on the upper 2-bits of the tracking phase accumulator, and the complex result can be stored in accumulated phase difference (APD) registers of the phase difference calculation circuit. The stored complex result can be converted to scalar phase in a wide variety of ways. For example, an arctangent function can be used to convert the stored complex result to scalar phase, but this function can be costly in silicon. In other implementations, a known $2^N$ number of 1-bit samples can be accumulated into the APD registers, and the accumulated value can then be scaled, such as by using left shifting, to a full resolution corresponding to $2\pi$ radians.

When the PLL operates with an integer setting or near-integer setting, samples of the local oscillator I and Q clock signals can be correlated, since the samples can repeat at about the same phase. When using 1-bit quantization, averaging may not improve an accuracy of the measurement.

In certain implementations, the PLL's operating frequency (and correspondingly the tracking digital phase signal) is modified before making initial phase measurement by modifying the PLL's division rate, such as by substituting the fractional frequency tuning signal's least-significant bits (LSBs). The frequency is modified to cause variation in the phase sampling, thereby providing measurement accuracy over time and de-correlating captured samples of the local oscillator signals. The frequency modification is relatively small and contained within the PLL loop bandwidth, such that the PLL does not lose lock or slip cycles during calibration.

When synchronizing phase of several PLLs across many transceiver chips, it is desirable for the PLLs not only to be initially synchronized in phase, but also to allow the PLL's to be reprogrammed to different frequencies over time while maintaining phase synchronization. Implementing the PLLs in this manner permits frequency hopping without requiring additional multi-chip synchronization sequences, thereby facilitating operation in massive MIMO systems, such as fifth generation (5G) systems.

To obtain a reference for synchronization, each transceiver can include a master phase control circuit, which can be reset via a multi-chip synchronization mechanism. The master phase control circuit of each synchronized transceiver can have the same value at a given time. Thus, the master phase control circuit generates a digital representation of a desired phase of the local oscillator signal. In certain implementations, the master phase control circuit includes a master phase accumulator that is incremented by a fractional frequency tuning signal at each cycle of the reference clock signal, and can wrap when reaching the modulus of the PLL's sigma-delta modulator. The master phase accumulator continues to operate on the unmodified fractional frequency tuning signal during the calibration, even when the tracking phase accumulator's frequency is being varied to provide un-correlated observations of the local oscillator signal.

The master phase control circuit can operate in conjunction with the tracking phase accumulator and the phase difference calculation circuit to determine a total phase modification to apply to the PLL at the end of calibration. In certain implementations, the total phase modification corresponds to about $\Delta\phi+\phi_M-\phi_T$, where $\Delta\phi$ is the phase difference signal generated by the phase difference calculation circuit, $\phi_M$ is the master digital phase signal generated by the master phase control circuit, and $\phi_T$ is the tracking phase accumulator's phase value. In certain configurations, the total phase modification is applied into a first stage of an accumulator of a sigma-delta modulator of the PLL to provide phase synchronization. The total phase modification can be applied over multiple cycles of the reference clock signal to maintain the PLL in lock and/or to avoid slipping clock cycles during phase synchronization.

To allow the master digital phase signal to be recomputed after the PLL's frequency changes, each PLL can include a master counter implemented as frequency independent +1 counter. The master counter can be implemented with sufficient precision, such as 64 or more bits, to avoid wrapping during operation of the PLL. The PLL can further include circuitry that computes a fixed cycle-length iterative multiply/modulus function, thereby computing the master digital phase signal from the master counter whenever a phase calibration is initiated.

After the initial phase adjustment has been completed during an initial calibration mode, a tracking calibration mode can be enabled to permit small changes to be applied automatically to keep the PLL aligned to the master digital phase signal. In certain implementations, the PLL is included in a transceiver, and the initial calibration mode is performed when the transceiver is not operating, while the tracking calibration mode is a background calibration performed while the transceiver is operating.

Accordingly, a PLL can be implemented to operate in a first or initial calibration mode associated with initial phase calibration and a second or tracking calibration mode associated with tracking calibration. In the tracking calibration mode, the calibration can be a background calibration occurring during normal operation of the PLL when a transceiver is operating. Thus, during the tracking calibration mode, the fractional frequency tuning signal can remain constant. During the tracking calibration mode, a longer time period can be used for data collection/observations of the local oscillator signal, thereby allowing sufficient averaging to properly observe the PLL's output phase for near-integer settings of the PLL's division rate.

In certain configurations, a PLL includes an NCO used to convert the tracking digital phase signal to an I/Q vector. Additionally, the NCO operates with different resolution during tracking calibration relative to initial calibration. In one example, the NCO can switch from a 2-state mode to a 3-state mode to allow operation with integer divide values of the PLL.

The teachings herein can be used to provide phase synchronization of multiple PLLs, including PLLs located on separate transceiver chips. The phase synchronization is flexible, and provides greater flexibility in phase synchronization relative to schemes that allow limited opportunities for phase synchronization. The teachings can also allow transmissions to occur during synchronization by providing a tracking calibration mode. The phase synchronization can also allow for temperature effects of the loop filter and/or VCO to be compensated. The teachings herein can be applied to fractional-N PLLs both set to fractional divisors and integer divisors. Furthermore, the phase synchronization schemes can be used while maintaining PLL lock, and can track during real-time operation of the PLL.

FIG. 1A is a schematic diagram of one embodiment of a massive MIMO base station 10. The massive MIMO base station 10 includes a first antenna array 1a and a second antenna array 1b, each including multiple antennas 11. Although one specific example is illustrated, a massive MIMO base station can include more or fewer antenna arrays. Moreover, the antenna arrays can be arranged in other ways and/or can include more or fewer antennas.

The massive MIMO base station 10 illustrates one example of an RF communication system that can include phase synchronization circuits implemented in accordance with the teachings herein. For example, the massive MIMO base station 10 includes a relatively large number of parallel RF transceivers (for instance, 100 or more transceivers) that simultaneously process multiple RF frequency bands. Additionally, the massive MIMO base station 10 can include PLLs used to generate local oscillator signals for the transceivers, and the PLLs can be phase synchronized in accordance with the teachings herein.

Routing a common high speed local oscillator signal in the massive MIMO base station, such as the massive MIMO base station 10 of FIG. 1A, can be costly in terms of circuit board area and/or system power. To reduce or alleviate such costs, it is desirable to have multiple local oscillator signals that are generated with multiple PLLs using a distributed reference clock signal. The massive MIMO base station 10 and other MIMO and beamforming systems may rely upon a static relationship between phases of local oscillator signals used for transmitting and/or receiving signals via the antennas 11. Although a periodic calibration can be performed to discover the phase of the local oscillator signal associated with each antenna 11, a relatively high rate of phase divergence can result in the calibration being performed relatively often. Accordingly, it is desirable for the PLLs used to generate local oscillator signals to have a phase synchronization function that synchronizes the phase of the local oscillator signals to a reference clock signal.

Although the massive MIMO base station 10 of FIG. 1A illustrates one example of an RF communication system that can include phase synchronization circuits, the teachings herein are applicable to a wide variety of RF communication systems. For example, the teachings herein can be used in other configurations of base stations, and are also applicable to other types of RF communication systems, such as mobile or wireless devices.

The phase synchronization circuits described herein can be used to provide PLL phase synchronization in a wide range of applications, including, for example, cellular, microwave, very small aperture terminal (VSAT), test equipment, and/or sensor applications. The phase synchronization circuits can synchronize PLLs operating in a variety of frequencies, including not only those used for cellular communications, such as 3G, 4G, WiMAX, LTE, and Advanced LTE communications, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Figure 1B:
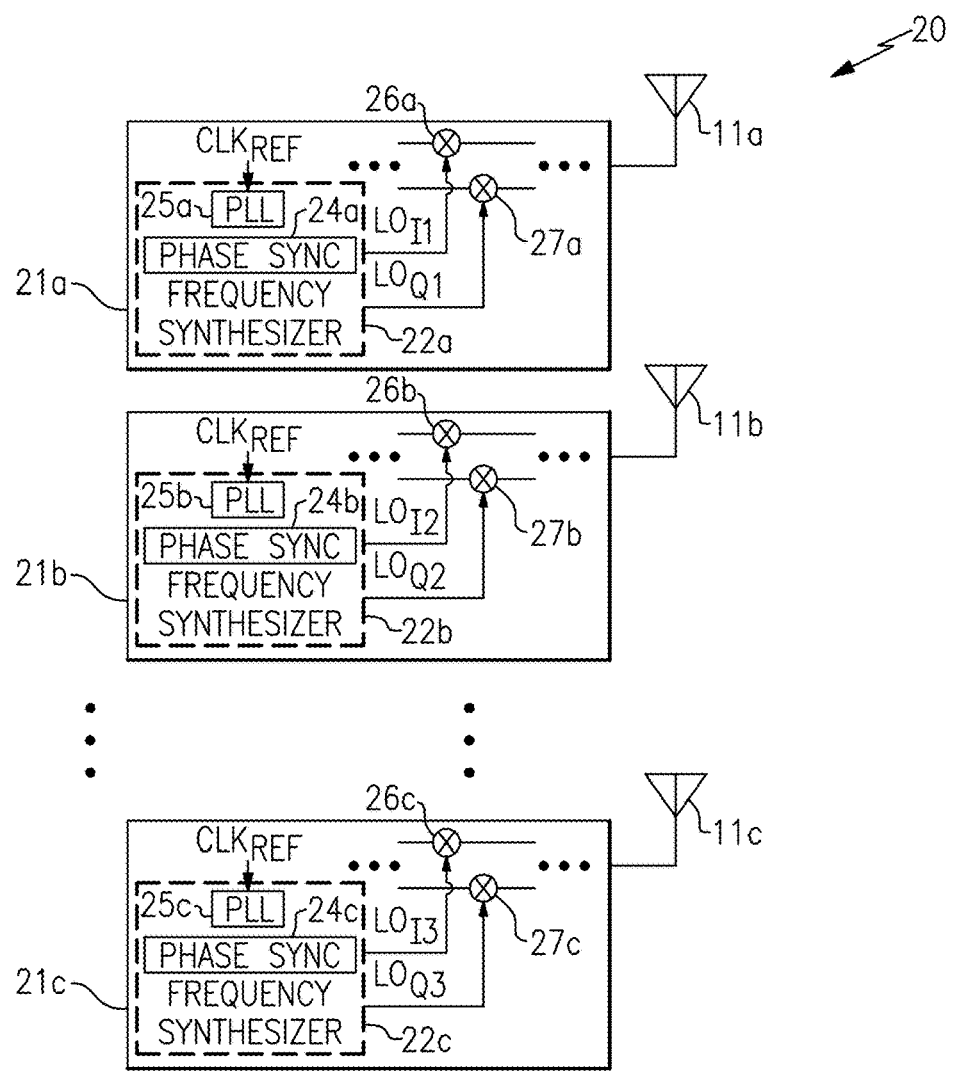
FIG. 1B is a schematic diagram of one embodiment of a transceiver system for the massive MIMO base station of FIG. 1A.

FIG. 1B is a schematic diagram of one embodiment of a transceiver system 20 for the massive MIMO base station 10 of FIG. 1A. The transceiver system 20 includes a first transceiver 21a coupled to a first antenna 11a, a second transceiver 21b coupled to a second antenna 11b, and a third transceiver 21c coupled to a third antenna 11c. Although a transceiver system 30 including three transceivers and three antennas is shown, the transceiver system 30 can include more or fewer transceivers and/or antennas.

In the illustrated embodiment, the first transceiver 21a includes a first frequency synthesizer 22a that generates a first in-phase (I) local oscillator signal $LO_{I1}$ for a first I-path mixer 26a and that generates a first quadrature-phase (Q) local oscillator signal $LO_{Q1}$ for a first Q-path mixer 27a. As shown in FIG. 1B, the first frequency synthesizer 22a includes a first PLL 25a and a first phase synchronization circuit 24a used to synchronize a phase of the first PLL 25a relative to a common reference clock $CLK_{REF}$. Similarly, the second transceiver 21b includes a second frequency synthesizer 22b that generates a second I local oscillator signal $LO_{I2}$ for a second I-path mixer 26b and that generates a second Q local oscillator signal $LO_{Q2}$ for a second Q-path mixer 27b. The second frequency synthesizer 22b includes a second PLL 25b and a second phase synchronization circuit 24b used to synchronize a phase of the second PLL 25b relative to the common reference clock $CLK_{REF}$. Likewise, the third transceiver 21c includes a third frequency synthesizer 22c that generates a third I local oscillator signal $LO_{I3}$ for a third I-path mixer 26c and that generates a third Q local oscillator signal $LO_{Q3}$ for a third Q-path mixer 27c. The third frequency synthesizer 22c includes a third PLL 25c and a third phase synchronization circuit 24c used to synchronize a phase of the third PLL 25c relative to the common reference clock $CLK_{REF}$.

The local oscillator signals can be used in the transceivers 21a-23c for a wide variety of purposes, such as frequency up-conversion and/or frequency down-conversion. For example, the mixers 23a-23c can be used for up-conversion of signals transmitted on the antennas 11a-11c, respectively, and/or for down-conversion of signals received on the antennas 11a-11c, respectively. In certain implementations, each of the transceivers 21a-21c is on a separate semiconductor die or chip.

When synchronizing phases of several PLLs across multiple transceiver chips, it is desirable for the PLLs not only to be initially synchronized in phase, but also to allow the PLL's to be reprogrammed to different frequencies over time while maintaining phase synchronization. Implementing the PLLs in this manner permits frequency hopping without additional multi-chip synchronization sequences, thereby facilitating operation in massive MIMO systems, such as fifth generation (5G) systems.

Although the transceiver system 20 of FIG. 1B illustrates one example of an RF communication system that can include phase synchronization circuits, the teachings herein are applicable to a wide variety of RF communication systems.

Figure 2:
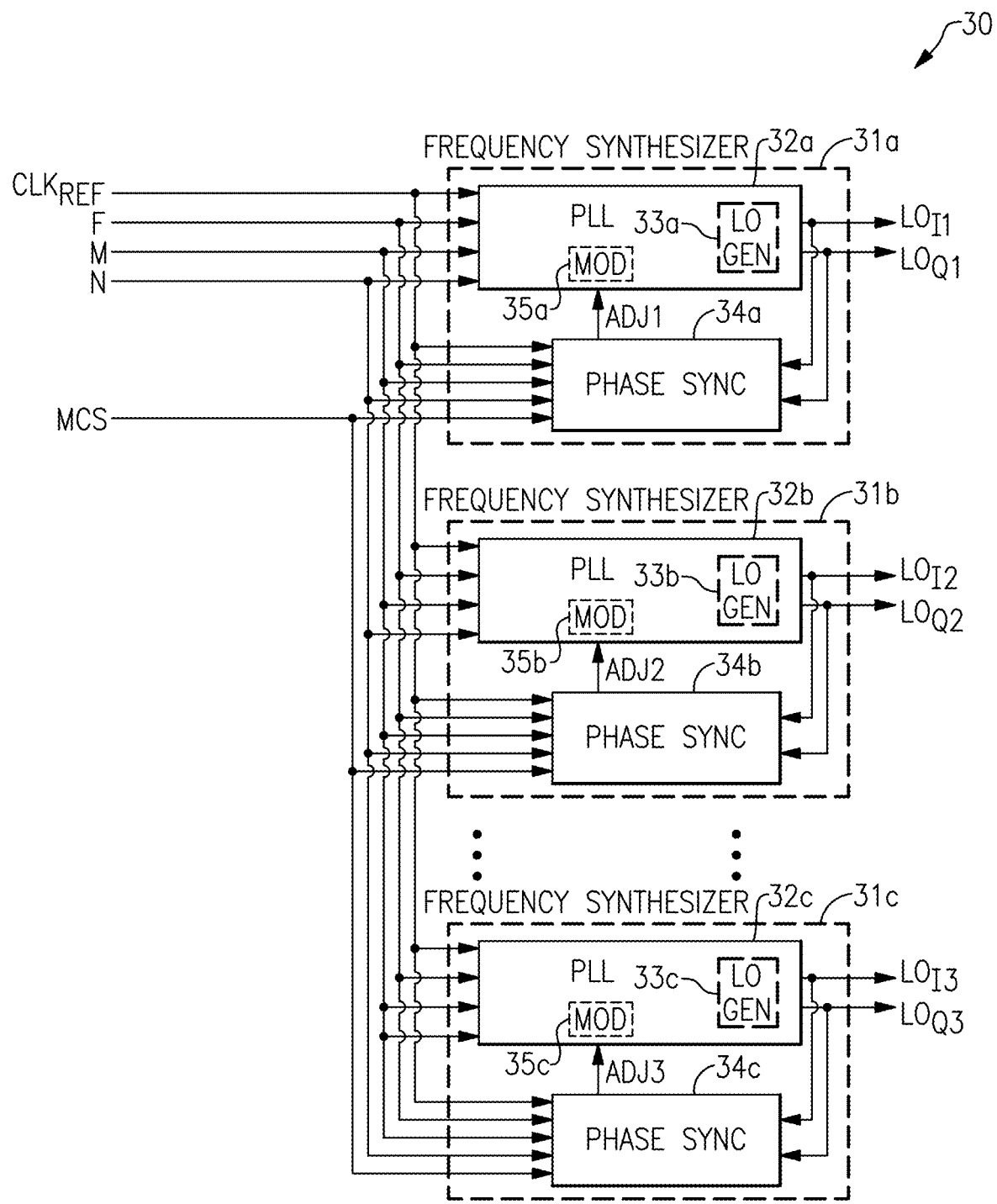
FIG. 2 is a schematic diagram of one embodiment of an RF communication system.

FIG. 2 is a schematic diagram of one embodiment of an RF communication system 30. The RF communication system 30 includes a first frequency synthesizer 31a, a second frequency synthesizer 31b, and a third frequency synthesizer 31c.

As shown in FIG. 2, the first frequency synthesizer 31a includes a first PLL 32a and a first phase synchronization circuit 34a. Additionally, the second frequency synthesizer 31b includes a second PLL 32b and a second phase synchronization circuit 34b. Furthermore, the third frequency synthesizer 31c includes a third PLL 32c and a third phase synchronization circuit 34c.

Although the RF communication system 30 is illustrated as including three frequency synthesizers, the RF communication system 30 can be adapted to include more or fewer frequency synthesizers. In certain configurations, the first, second, and third frequency synthesizers 31a-31c are disposed on separate integrated circuits (ICs) or dies.

In the illustrated configuration, the frequency synthesizers 31a-31c each receive a reference clock signal $CLK_{REF}$, a fractional frequency tuning signal F, a modulus signal M, an integer frequency tuning signal N, and a synchronization signal MCS. Furthermore, each of the PLLs 32a-32c generates different output clock signals. For example, the first PLL 32a includes a first local oscillator generator 33a that generates a first I local oscillator signal $L_{OI1}$ and a first Q local oscillator signal $LO_{Q1}$. Additionally, the second PLL 32b includes a second local oscillator generator 33b that generates a second I local oscillator signal $L_{OI2}$ and a second Q local oscillator signal $LO_{Q2}$. Furthermore, the third PLL 32c includes a third local oscillator generator 33c that generates a third I local oscillator signal $L_{OI3}$ and a third Q local oscillator signal $LO_{Q3}$.

The fractional frequency tuning signal F, the modulus signal M, and the integer frequency tuning signal N can be used to control a frequency of the local oscillator signals generated by the PLLs 32a-32c relative to the frequency of the reference clock signal $CLK_{REF}$. For example, at steady state, the local oscillator signals generated by the PLLs 32a-32c are controlled to be about N+F/M times the reference clock signal's frequency. The fractional frequency tuning signal F, the modulus signal M, and the integer frequency tuning signal N can each be multi-bit digital signals. In one embodiment, the fractional frequency tuning signal F carries at least 23 bits, the modulus signal M carries at least 23 bits, and the integer frequency tuning signal N caries at least 10 bits.

Absent a phase synchronization mechanism, the PLLs 32a-32c can lock unpredictably to one of a multitude of possible phases of the reference clock signal $CLK_{REF}$. In certain electronic systems, it can be desirable to synchronize the phase of a PLL's output clock signal to a known relationship with respect to a reference clock signal. For example, in multi-PLL systems, such as the RF communication system 30 of FIG. 2, it may be important to maintain a known phase relationship between the output clock signals of the PLLs.

The illustrated configuration can be used to synchronize the phases of the PLLs 32a-32c to a common output phase with respect to the reference clock signal $CLK_{REF}$. For example, the first phase synchronization circuit 34a generates a first phase adjustment signal ADJ1 for adjusting the phase of the first PLL 32a, the second phase synchronization circuit 34b generates a second phase adjustment signal ADJ2 for adjusting the phase of the second PLL 32b, and the third phase synchronization circuit 34c generates a third phase adjustment signal ADJ3 for adjusting the phase of the third PLL 32c.

In certain implementations, the phase synchronization circuits 34a-34c provide phase adjustment by providing adjustment to modulators of the PLLs 32a-32c, respectively. For example, the first phase adjustment signal ADJ1 can adjust a state of a first modulator 35a of the first PLL 32a, the second phase adjustment signal ADJ2 can adjust a state of a second modulator 35b of the second PLL 32b, and the third phase adjustment signal ADJ3 can adjust a state of a third modulator 35c of the third PLL 32c. In certain implementations, the modulators 35a-35c are implemented as sigma-delta modulators, and phase adjustment is provided by adding a phase offset to the accumulator of a particular sigma-delta modulator. Although various examples of phase adjustment by adjusting the state of modulators has been described, phase adjustment can be provided to a PLL in a wide variety of ways.

The phase synchronization circuits 34a-34c can be implemented using any of the configurations disclosed herein, including, for example, any of the embodiment discussed below with respect to FIGS. 3A-9.

In certain embodiments, the phase synchronization circuit associated with a particular PLL includes a sampling circuit that generates samples by sampling the PLL's local oscillator signals based on timing of the reference clock signal $CLK_{REF}$, a phase difference calculation circuit that generates a phase difference signal based on the samples and a tracking digital phase signal representing the phase of the PLL, a master phase control circuit that generates a master digital phase signal that is resettable by the synchronization signal MCS, and a phase adjustment control circuit that provides a phase adjustment to the PLL based on the phase difference signal, the tracking digital phase signal, and the master digital phase signal.

By including the phase synchronization circuits 34a-34c in the PLLs 32a-32c, respectively, the phases of the PLLs 32a-32c can be synchronized to a desired phase with respect to the reference clock signal $CLK_{REF}$. In certain implementations, the phase synchronization circuits 34a-34c are used to phase synchronize the PLLs 32a-32c to the same phase.

The synchronization signal MCS can be implemented in a wide variety of ways. In certain implementations, one or more PLLs are implemented on separate semiconductor chips, and the synchronization signal MCS is a multi-chip synchronization signal. The synchronization signal MCS can be used to initialize the phase synchronization circuits 34a-34c such that they each operate with a master digital phase signal of the same value. In certain implementations, the phase synchronization circuits 34a-34c are implemented such the phase synchronization circuits 34a-34c are initialized using the synchronization signal MCS at a start-up of the RF communication system 30, and thereafter remain synchronized without additional synchronization sequences, even when the fractional frequency tuning signal F, the modulus signal M, and/or the integer frequency tuning signal N change value. Implementing the phase synchronization circuits 34a-34c in this manner enhances flexibility of the RF communication system 30 by permitting frequency hopping.

Although the RF communication system 30 of FIG. 3 illustrates one example of an RF communication system that can include frequency synthesizers implemented with phase synchronization circuits, the teachings herein are applicable to a wide variety of RF communication systems.

Additional details of the frequency synthesizers 31a-31c can be as described herein.

Figure 3A:
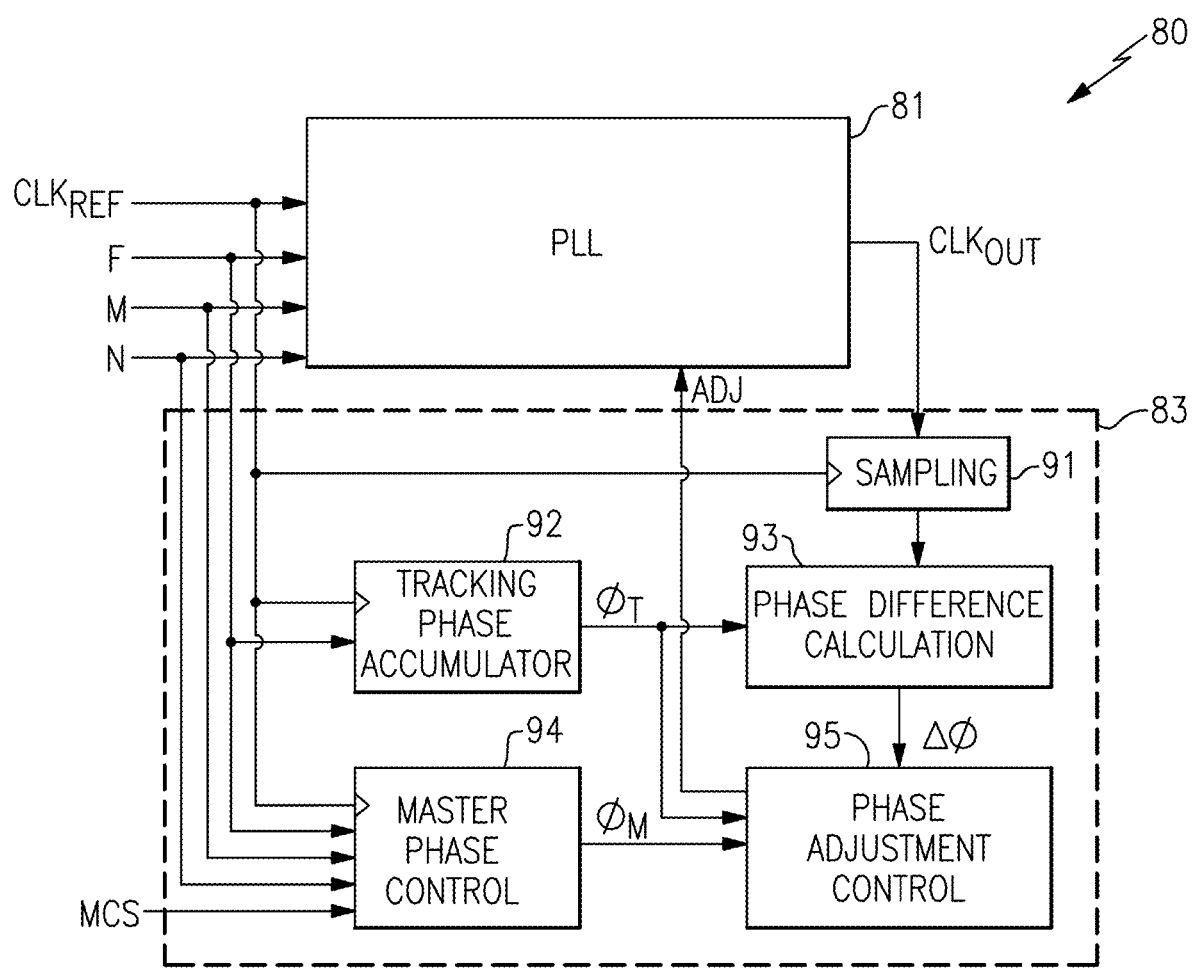
FIG. 3A is a schematic diagram of a frequency synthesizer according to one embodiment.

FIG. 3A is a schematic diagram of a frequency synthesizer 80 according to one embodiment. The frequency synthesizer 80 includes a PLL 81 and a phase synchronization circuit 83. The frequency synthesizer 80 receives a reference clock signal $CLK_{REF}$, a fractional frequency tuning signal F, a modulus signal M, an integer frequency tuning signal N, and a synchronization signal MCS.

The illustrated PLL 81 generates an output clock signal $CLK_{OUT}$, which is provided to the phase synchronization circuit 83. At steady state, the frequency of the output clock signal $CLK_{OUT}$ is controlled to be about N+F/M times the reference clock signal's frequency.

The illustrated phase synchronization circuit 83 includes a sampling circuit 91, a tracking phase accumulator 92, a phase difference calculation circuit 93, a master phase control circuit 94, and a phase adjustment control circuit 95.

The sampling circuit 91 generates samples by sampling the output clock signal OUT based on timing of the reference clock signal $CLK_{REF}$. In one embodiment, the sampling circuit 91 includes at least one current mode logic (CML) sampling circuit. However, the sampling circuit 91 can be implemented in other ways. The illustrated phase synchronization circuit 83 determines an output phase of the PLL 81 based on sampling the PLL's output clock signal $CLK_{OUT}$.

The tracking phase accumulator 92 generates a tracking digital phase signal $\phi_T$ representing the phase of the PLL 81. The tracking phase accumulator 92 updates a value of the tracking digital phase signal $\phi_T$ based on the fractional frequency tuning signal F and timing of the reference clock signal $CLK_{REF}$. For example, the value of the tracking phase accumulator 92 can be incremented by the fractional frequency tuning signal F in response to an edge of the reference clock signal $CLK_{REF}$, such as a rising or falling edge. The tracking digital phase signal $\phi_T$ is a digital representation of the phase of the PLL 81.

Tracking the phase of the PLL 81 in this matter avoids limitations associated with obtaining phase information from an accumulator of a modulator of the PLL 81. For example, when the PLL 81 is implemented using a sigma-delta modulator, sigma-delta noise can make phase observation difficult, since the accumulator can be updated using a feedback clock signal of the PLL 81, rather than using the reference clock signal $CLK_{REF}$.

The phase difference calculation circuit 93 generates a phase difference signal $\Delta\phi$ based on the samples from the sampling circuit 91 and the tracking digital phase signal $\phi_T$ from the tracking phase accumulator 92. The phase difference calculation circuit 93 provides the phase difference signal $\Delta\phi$ to the phase adjustment control circuit 95. In certain implementations, the phase difference calculation circuit 93 accumulates a difference in phase between the tracking digital phase signal $\phi_T$ and a PLL output phase indicated by the samples. Thus, the phase difference signal $\Delta\phi$ can be generated statistically based on samples taken at different time instances.

The master phase control circuit 94 generates a master digital phase signal $\phi_M$ representing a desired phase of the PLL 81. The master digital phase signal $\phi_M$ is provided to the phase adjustment control circuit 95. In certain implementations, the master phase control circuit 94 includes a master counter that generates a master count signal based on timing of the reference clock signal $CLK_{REF}$ and the synchronization signal MCS. For example, the master counter can be resettable by the synchronization signal MCS, and can operate as a frequency independent +1 counter that increments based on timing of the reference clock signal $CLK_{REF}$. The master counter can be implemented with sufficient precision, such as 64 or more bits, to avoid wrapping during operation of the PLL 81.

In one embodiment, the master phase control circuit 94 can include a master phase calculation circuit that computes the master digital phase signal $\phi_M$ from the master counter whenever a phase calibration is initiated. For example, an instantaneous master phase signal can be computed based on a function (G*F) % M, where G is the count of the master counter, F is a value of the fractional frequency tuning signal, M is a value of the modulus signal, and % is mathematical modulo operation. Computing the master digital phase signal $\phi_M$ in this manner can aid in providing a correct value of the master digital phase signal $\phi_M$ even when synchronization via the synchronization signal MCS occurs before the fractional frequency tuning signal F, the modulus signal M, and/or the integer frequency tuning signal N are controlled to their desired values.

In certain implementations, the master phase control circuit 94 also includes a master phase accumulator that is initialized using the instantaneous master phase signal generated by the master phase calculation circuit. Additionally, the master phase accumulator can update the master digital phase signal $\phi_M$ based on the fractional frequency tuning signal F and timing of the reference clock signal $CLK_{REF}$. Including the master phase accumulator can reduce computations by allowing an instantaneous master phase signal to be initially calculated and thereafter updated via the master phase accumulator. However, in other implementations, the master phase accumulator is omitted.

The phase adjustment control circuit 95 generates a phase adjustment signal ADJ based on the phase difference signal $\Delta\phi$. The phase adjustment signal ADJ is provided to the PLL 81 to provide phase synchronization. The phase adjustment control circuit 95 can provide phase adjustment in a wide variety of ways, including, but not limited to, adjusting a state of a modulator of the PLL 81.

In the illustrated embodiment, the phase adjustment control circuit 95 also provides phase adjustment to the PLL 81 based on the master digital phase signal $\phi_M$ and the tracking digital phase signal $\phi_T$. In certain implementations, the total phase adjustment provided by the phase adjustment signal ADJ corresponds to about $\Delta\phi+\phi_M-\phi_T$.

In one embodiment, the tracking digital phase signal $\phi_T$ has between 8 bits and 23 bits, the master digital phase signal $\phi_M$ has between 8 bits and 23 bits, and the phase difference signal $\Delta\phi$ has between 8 bits and 23 bits. However, other bit values are possible, such as bit values that depend on application and/or implementation.

The illustrated phase synchronization circuit 83 operates as a digital slow loop for the PLL 81. The digital slow loop samples the PLL's output clock signal and synchronizes the observed output phase relative to the master digital phase signal $\phi_M$. By controlling the master digital phase signal $\phi_M$ to the same value across multiple frequency synthesizers (for example, frequency synthesizers associated with multiple transceiver chips), the phase of multiple PLLs can be globally synchronized.

Additional details of the frequency synthesizer 80 can be similar to those described earlier.

Figure 3B:
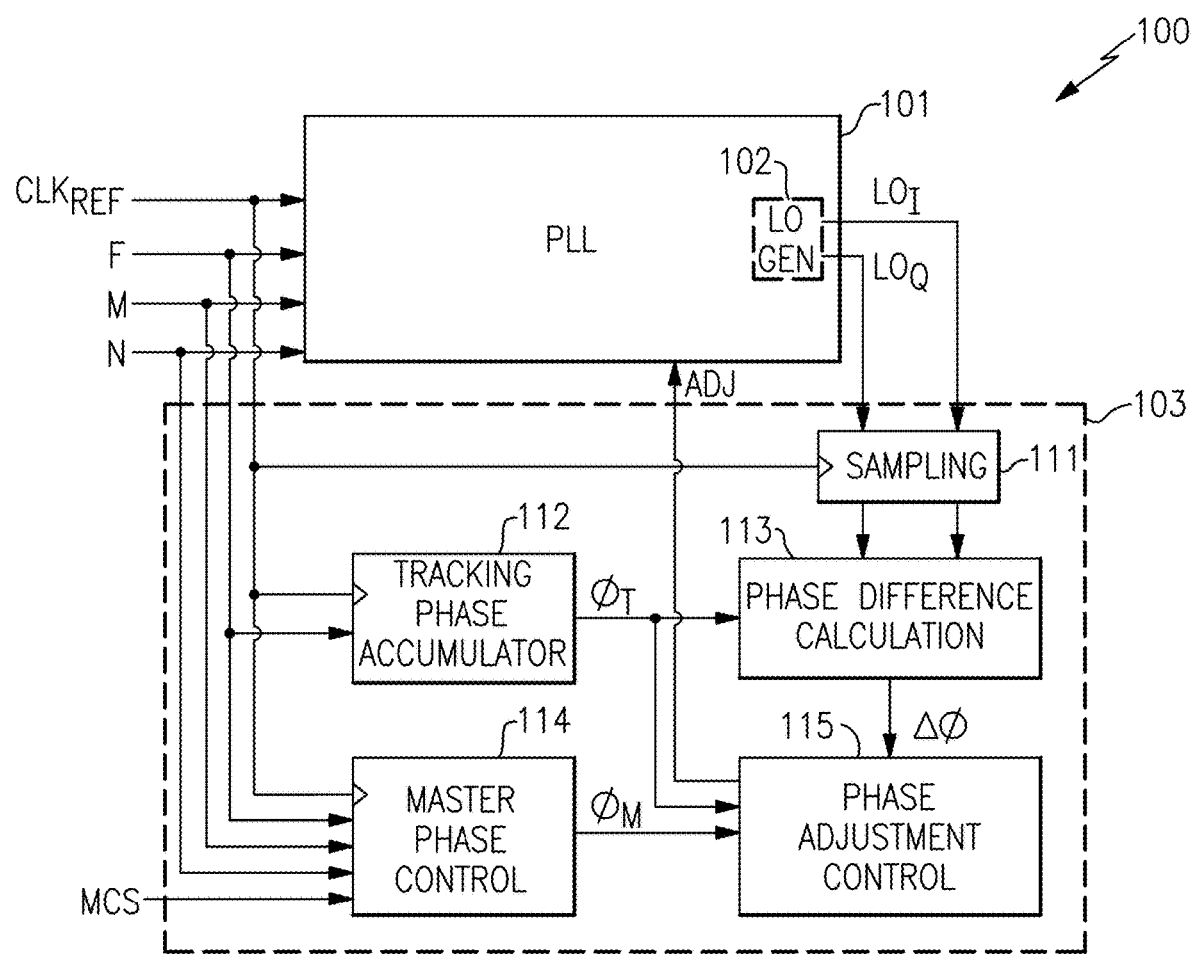
FIG. 3B is a schematic diagram of a frequency synthesizer according to another embodiment.

FIG. 3B is a schematic diagram of a frequency synthesizer 100 according to another embodiment. The frequency synthesizer 100 includes a PLL 101 and a phase synchronization circuit 103. The frequency synthesizer 100 receives a reference clock signal $CLK_{REF}$, a fractional frequency tuning signal F, a modulus signal M, an integer frequency tuning signal N, and a synchronization signal MCS.

The illustrated PLL 101 includes a local oscillator generator 102 that generates an in-phase (I) local oscillator signal $LO_I$ and a quadrature-phase (Q) local oscillator signal $LO_Q$. The I and Q local oscillator signals $LO_I$, $LO_Q$ can have substantially the same frequency, but a phase separation of about 90 degrees. At steady state, the frequency of the I and Q local oscillator signals $LO_I$, $LO_Q$ can be about N+F/M times the reference clock signal's frequency.

The local oscillator generator 102 can be implemented in a wide variety of ways. In one example, the local oscillator generator 102 is implemented using a quadrature divider that divides a clock signal generated by a voltage-controlled oscillator. In another example, the local oscillator generator 102 is implemented using a polyphase filter. Although various examples of local oscillator generators have been described, the local oscillator generator 102 can be implemented in other ways.

The illustrated phase synchronization circuit 103 includes a sampling circuit 111, a tracking phase accumulator 112, a phase difference calculation circuit 113, a master phase control circuit 114, and a phase adjustment control circuit 115.

The phase synchronization circuit 103 of FIG. 3B is similar to the phase synchronization circuit 83 of FIG. 3A, except that the phase synchronization circuit 103 operates using samples taken from the I and Q local oscillator signals $LO_I$, $LO_Q$. In particular, the sampling circuit 111 provides both samples of the I local oscillator signal $LO_I$ and samples of the Q local oscillator signal $LO_Q$ to the phase difference calculation circuit 113.

Additional details of the frequency synthesizer 100 can be similar to those described earlier.

Figure 4A:
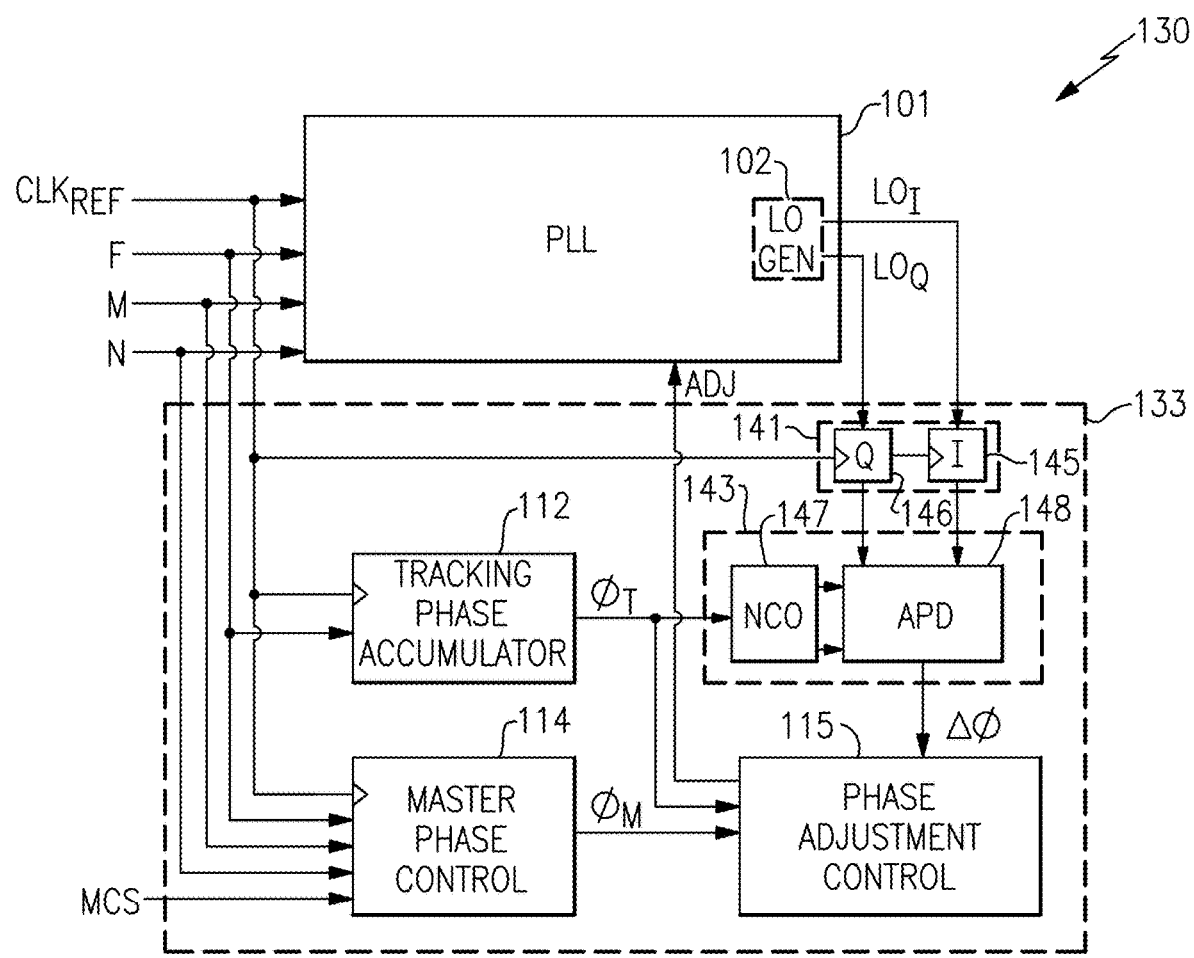
FIG. 4A is a schematic diagram of a frequency synthesizer according to another embodiment.

FIG. 4A is a schematic diagram of a frequency synthesizer 130 according to another embodiment. The frequency synthesizer 130 includes a PLL 101 and a phase synchronization circuit 133. The frequency synthesizer 130 receives a reference clock signal $CLK_{REF}$, a fractional frequency tuning signal F, a modulus signal M, an integer frequency tuning signal N, and a synchronization signal MCS. The illustrated phase synchronization circuit 133 includes a sampling circuit 141, a tracking phase accumulator 112, a phase difference calculation circuit 143, a master phase control circuit 114, and a phase adjustment control circuit 115.

The frequency synthesizer 130 of FIG. 4A is similar to the frequency synthesizer 100 of FIG. 3B, except that the frequency synthesizer 130 of FIG. 4A illustrates a specific implementation of a sampling circuit and phase difference calculation circuit.

For example, the sampling circuit 141 of FIG. 4A includes an I sampler 145 and a Q sampler 146. Additionally, the phase difference calculation circuit 143 includes a numerically controlled oscillator (NCO) 147 and an accumulated phase difference (APD) calculator 148.

Although FIG. 4A illustrates one embodiment of a sampling circuit, a sampling circuit can be implemented in a wide variety of ways. Additionally, although FIG. 4A illustrates one embodiment of a phase difference calculation circuit, a phase difference calculation circuit can be implemented in a wide variety of ways.

In the illustrated embodiment, the I sampler 145 captures samples of the I local oscillator signal $LO_I$ based on timing of the reference clock signal $CLK_{REF}$, and the Q sampler 146 captures samples of the Q local oscillator signal $LO_Q$ based on timing of the reference clock signal $CLK_{REF}$. The captured I and Q samples are provided to the APD calculator 148. Additionally, the NCO 147 receives the tracking digital phase signal $\phi_T$, and generates an I phase signal and a Q phase signal that are provided to the APD calculator 148. The NCO 147 operates to convert the tracking phase accumulator's phase into an I/Q vector.

The APD calculator 148 processes the I and Q samples from the sampling circuit 141 and the I phase signal and the Q phase signal from the NCO 147 to generate the phase difference signal $\Delta\phi$. The APD calculator 148 compares samples of the output phase of the PLL 101 to the tracking digital phase signal $\phi_T$, and thus statistically computes the phase difference signal $\Delta\phi$.

In certain implementations, the local oscillator I clock signal and local oscillator Q signal are 1-bit signals, which collectively represent a phase quadrant in which the local oscillator signal is present. In certain implementations, a precision of the tracking phase accumulator 112 is implemented to at least match the fractional precision of the PLL 101, such that an arbitrarily accurate phase of the PLL 101 can be used for comparison by the phase difference calculation circuit 143.

In the illustrated embodiment, the phase difference between the tracking digital phase signal $\phi_T$ and the output phase indicated by the I and Q samples is computed by the phase difference calculation circuit 143. In certain implementations, the APD calculator 148 cross-multiplies the I/Q vector generated by the NCO 147 with the complex conjugate of the I/Q vector associated with the I and Q samples. Additionally, the APD calculator 148 accumulates the cross-multiplication products over time.

In one embodiment, the I and Q samples taken by the I and Q samplers 145, 146 are 1-bit, and a 1-bit resolution is employed for a resolution of the NCO 147. In such an embodiment, the cross-multiplications can be computed using combination logical on the two most significant bits of the tracking digital phase signal $\phi_T$, and the complex result can be stored in I and Q registers of the APD calculator 148. The complex accumulated phase difference can be converted to scalar phase in a wide variety of ways. In one example, an arctangent function can be used to convert the complex accumulated phase difference to scalar phase. In another example, a known $2^N$ number of 1-bit samples can be accumulated in the APD calculator 148, and the accumulated result can then be scaled, such as by using left shifting, to a full resolution corresponding to $2\pi$ radians. The result can be read from either the APD calculator's I register or Q register depending on the quadrant of the local oscillator signal. In one embodiment N is selected to be in the range of 256 samples to 8,388,608 samples.

Additional details of the frequency synthesizer 130 can be similar to those described earlier.

Figure 4B:
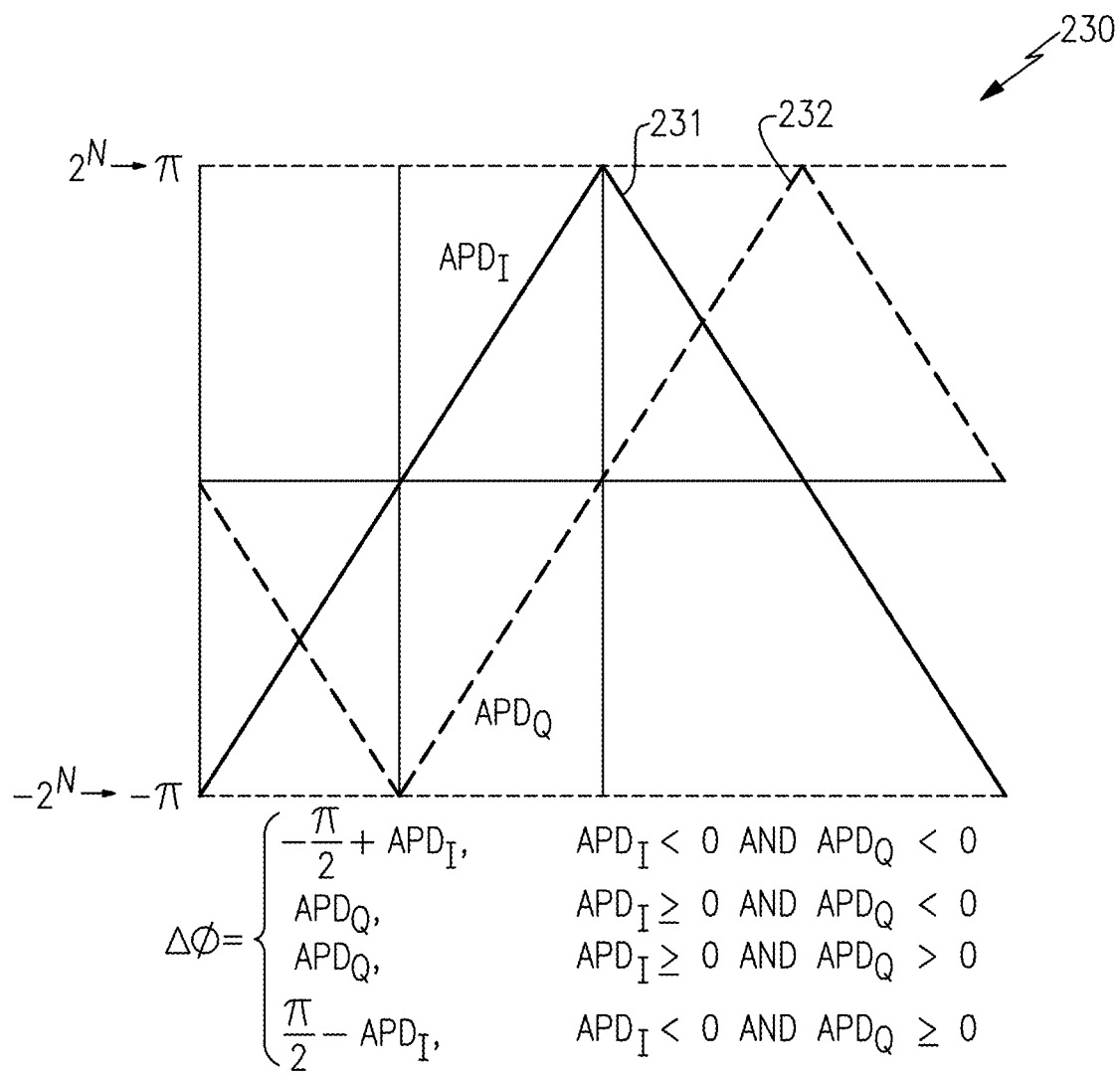
FIG. 4B is a graph illustrating operation of one embodiment of an accumulated phase difference calculator.

FIG. 4B is a graph 230 illustrating operation of one embodiment of an accumulated phase difference calculator. The graph 230 includes a first plot of an I accumulated phase different ($APD_I$) and a second plot 232 of a Q accumulated phase difference ($APD_Q$).

The graph 230 corresponds to an accumulated phase difference calculator that accumulates a known $2^N$ number of 1-bit samples in an I register (corresponding to the value of $APD_I$), and that accumulates a known $2^N$ number of 1-bit samples in a Q register (corresponding to the value of $APD_Q$). The graph 230 illustrates the generated value of the phase difference signal $\Delta\phi$ based on values of $APD_I$ and $APD_Q$. Table 1 below reproduces the value of the phase difference signal $\Delta\phi$ based on values of $APD_I$ and $APD_Q$ as shown in FIG. 4B.

TABLE 1

| phase difference signal $\Delta\phi$ | values of $APD_I$ and $APD_Q$ |
|---|---|
| $-\pi/2 + APD_I$ | $ADP_I < 0$ and $APD_Q < 0$ |
| $APD_Q$ | $APD_I >= 0$ and $APD_Q < 0$ |
| $APD_Q$ | $APD_I >= 0$ and $APD_Q > 0$ |
| $\pi/2 - APD_I$ | $APD_I < 0$ and $APD_Q >= 0$ |

The graph 230 of FIG. 4B and Table 1 illustrate one example of generating the phase difference signal $\Delta\phi$. In a second example, the phase difference signal $\Delta\phi$ is computed based on atan($APD_Q$/$APD_I$), where atan is the mathematical arctangent function. Although two examples of generating the phase difference signal $\Delta\phi$ have been described, the phase difference signal $\Delta\phi$ can be generated in a wide variety of ways.

Figure 5:
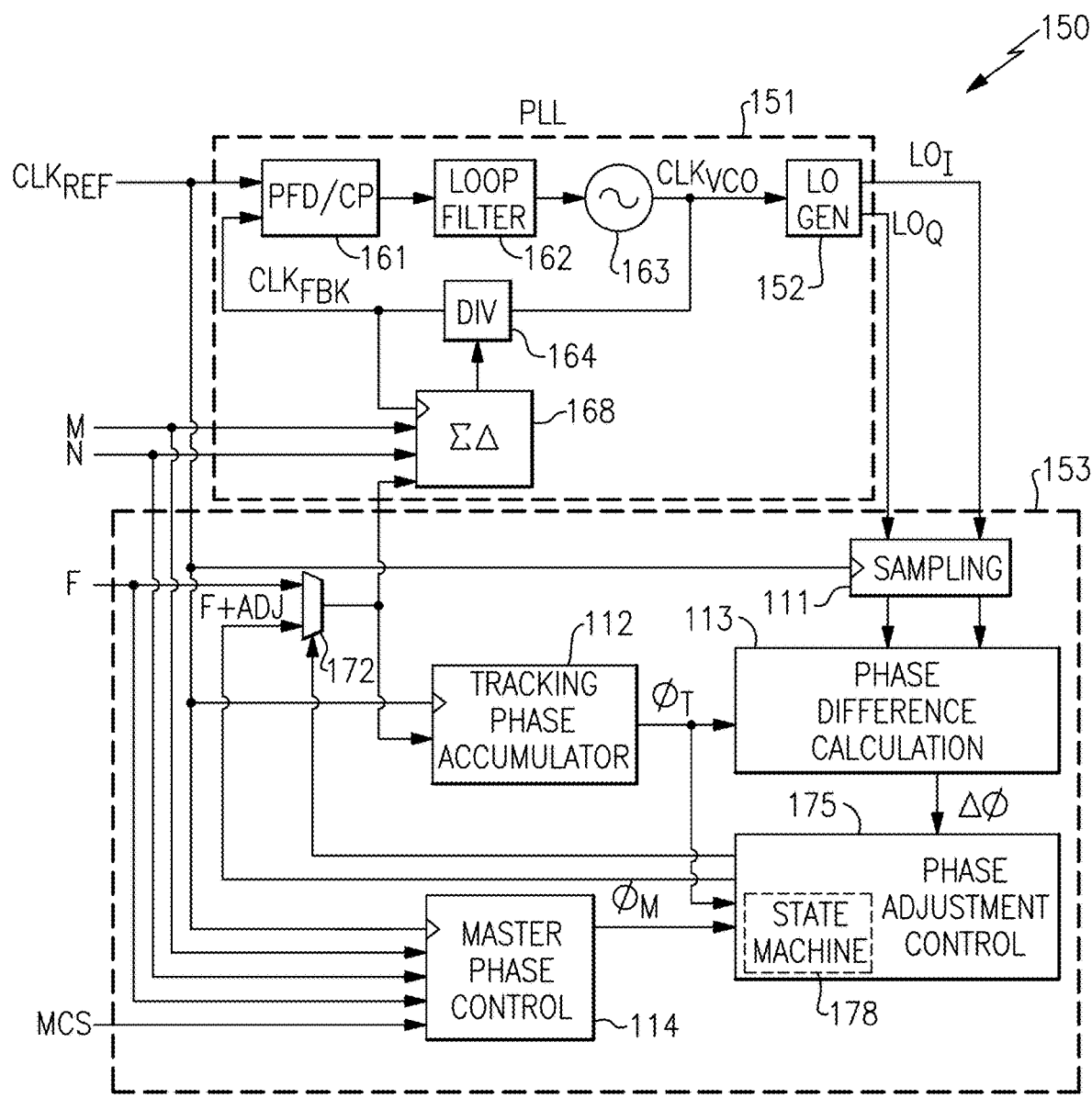
FIG. 5 is a schematic diagram of a frequency synthesizer according to another embodiment.

FIG. 5 is a schematic diagram of a frequency synthesizer 150 according to another embodiment. The frequency synthesizer 150 includes a PLL 151 and a phase synchronization circuit 153. The frequency synthesizer 150 receives a reference clock signal $CLK_{REF}$, a fractional frequency tuning signal F, a modulus signal M, an integer frequency tuning signal N, and a synchronization signal MCS.

The frequency synthesizer 150 of FIG. 5 is similar to the frequency synthesizer 100 of FIG. 3B, except that the frequency synthesizer 150 of FIG. 5 illustrates a specific implementation of PLL phase adjustment.

For example, the PLL 151 of FIG. 5 includes a phase-frequency detector/charge pump (PFD/CP) 161, a loop filter 162, a voltage controlled oscillator (VCO) 163, a feedback divider 164, a local oscillator generator 152, and a sigma-delta modulator 168. The PFD/CP 161 compares the reference clock signal $CLK_{REF}$ to a feedback clock signal $CLK_{FBK}$ generated by the feedback divider 164 to control a flow of current into or out of the loop filter 162. Additionally, the loop filter 162 generates a control voltage used to control an oscillation frequency of the VCO 163. The VCO 163 generates a VCO clock signal $CLK_{VCO}$, which is divided by the feedback divider 164 to generate the feedback clock signal $CLK_{FBK}$. The sigma-delta modulator 168 controls a division rate of the feedback divider 164. In the illustrated embodiment, the local oscillator generator 152 operates as a quadrature divider that divides the VCO clock signal $CLK_{VCO}$ to generate the I local oscillator signal $LO_I$ and the Q local oscillator signal $LO_Q$. Although FIG. 5 illustrates one implementation of a PLL, a PLL can be implemented in a wide variety of ways.

Additionally, the phase synchronization circuit 153 includes a sampling circuit 111, a tracking phase accumulator 112, a phase difference calculation circuit 113, a master phase control circuit 114, a phase adjustment control circuit 175, and a multiplexer or selector 172. The phase synchronization circuit 153 of FIG. 5 is similar to the phase synchronization circuit 103 of FIG. 3B, except that the phase synchronization circuit 153 includes the multiplexer 172 and a phase adjustment control circuit 175 that includes a state machine 178.

As shown in FIG. 5, the phase adjustment control circuit 175 generates an adjusted fractional frequency tuning signal F+ADJ. Additionally, the phase adjustment control circuit 175 controls the multiplexer 172 to select between the fractional frequency tuning signal F and the adjusted fractional frequency tuning signal F+ADJ. The selected fractional frequency tuning signal is provided to the tracking phase accumulator 112 and to the sigma-delta modulator 168 of the PLL 151.

In the illustrated embodiment, phase adjustment is provided by adding a phase offset to an accumulator of the sigma-delta modulator 168 of the PLL 151, thereby shifting the PLL's output phase by a corresponding offset. The phase adjustment is provided by providing the adjusted fractional frequency tuning signal F+ADJ to the sigma-delta modulator 168 for one or more cycles of the reference clock signal $CLK_{REF}$. In certain implementations, the value of the adjusted fractional frequency tuning signal F+ADJ is changed over time, and the phase adjustment is added in parts over multiple reference clock cycles, thereby maintaining the PLL 151 in lock without slipping cycles. In one example, the state machine 178 changes the value of the adjusted fractional frequency tuning signal F+ADJ over time and controls the selection of the multiplexer 172. By providing phase adjustment within the PLL's loop bandwidth, the PLL 151 maintains phase lock during phase adjustment.

As shown in FIG. 5, the tracking phase accumulator 112 also receives the selected fractional frequency tuning signal from the multiplexer 172. Thus, the tracking digital phase signal $\phi_T$ provides a digital representation of the phase of the PLL 151, including phase adjustment.

Additional details of the frequency synthesizer 150 can be similar to those described earlier.

Figure 6A:
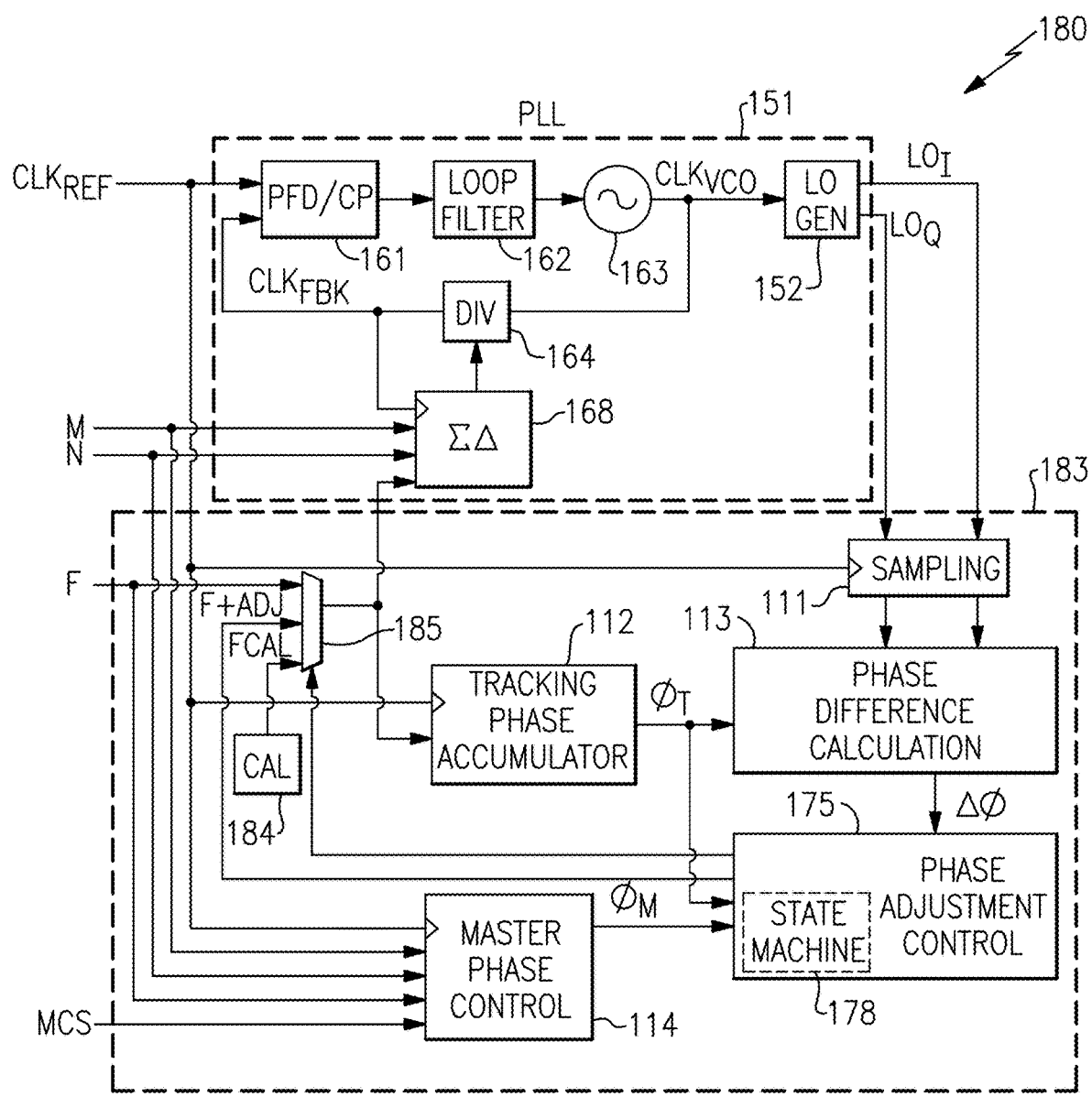
FIG. 6A is a schematic diagram of a frequency synthesizer according to another embodiment.

FIG. 6A is a schematic diagram of a frequency synthesizer 180 according to another embodiment. The frequency synthesizer 180 includes a PLL 151 and a phase synchronization circuit 183. The frequency synthesizer 180 receives a reference clock signal $CLK_{REF}$, a fractional frequency tuning signal F, a modulus signal M, an integer frequency tuning signal N, and a synchronization signal MCS.

The frequency synthesizer 180 of FIG. 6A is similar to the frequency synthesizer 150 of FIG. 5, except that the frequency synthesizer 180 of FIG. 6A illustrates a phase synchronization circuit that changes a frequency of a PLL during an initial calibration mode.

For example, the illustrated phase synchronization circuit 183 includes a sampling circuit 111, a tracking phase accumulator 112, a phase difference calculation circuit 113, a master phase control circuit 114, a phase adjustment control circuit 175, a calibration circuit 184, and a multiplexer 185. The phase synchronization circuit 183 of FIG. 6A is similar to the phase synchronization circuit 153 of FIG. 5, except that the phase synchronization circuit 183 includes the multiplexer 185 that selects amongst the fractional frequency tuning signal F, the adjusted fractional frequency tuning signal F+ADJ, and a calibration fractional frequency tuning signal FCAL. In the illustrated embodiment, the calibration or modified fractional frequency tuning signal FCAL is generated by the calibration circuit 184. However, other configurations are possible, such as implementations in which the calibration fractional frequency tuning signal FCAL is generated by the phase adjustment control circuit 175.

When a fractional-N PLL operates with an integer setting or near-integer setting, samples of the local oscillator I and Q clock signals can be correlated, since the samples can repeat at about the same phase. When using 1-bit quantization for the samples, averaging by the phase difference calculation circuit 113 may not improve an accuracy of the phase measurement.

The illustrated phase synchronization circuit 183 is operable in an initial calibration mode in which the phase adjustment control circuit 175 controls the multiplexer 185 to select the calibration fractional frequency tuning signal FCAL. Thus, the calibration fractional frequency tuning signal FCAL is provided to the sigma-delta modulator 168 and to the tracking phase accumulator 112 during the initial calibration mode. By selecting the calibration fractional frequency tuning signal FCAL, the phase synchronization circuit 183 varies the frequency of the PLL 151 to statistically decorrelate the samples captured by the sampling circuit 111 during the initial calibration mode.

In certain implementations, the calibration fractional frequency tuning signal FCAL provides frequency modification within the PLL's bandwidth, such that the PLL 151 maintains lock as the frequency is modified. Providing frequency modification that is relatively small and contained within the PLL's loop bandwidth prevents the PLL 151 from losing lock or slipping cycles during the initial calibration mode.

Accordingly, the illustrated embodiment modifies the PLL's operating frequency (and correspondingly the tracking digital phase signal $\phi_T$) by modifying the PLL's division rate during an initial calibration mode. In certain embodiments, the calibration fractional frequency tuning signal FCAL corresponds to a modified version of the fractional frequency tuning signal F. In one example, the calibration fractional frequency tuning signal FCAL is generated using at least one of the most significant bits (MSBs) of the fractional frequency tuning signal F, but one or more of the least significant bits (LSBs) of the fractional frequency tuning signal F are substituted or modified to generate the calibration fractional frequency tuning signal FCAL. The calibration circuit 184 can substitute the bits to cause variation in the phase at sampling times or points of the sampling circuit 111, thereby providing measurement accuracy over time and de-correlating captured samples of the local oscillator signals $LO_I$, $LO_Q$.

Although FIG. 6A illustrates one embodiment of a phase synchronization circuit that statistically de-correlates samples taken of a PLL's output clock signal(s), other configurations are possible. For example, in another embodiment, the phase adjustment control circuit 175 iteratively adjusts the phase of the PLL 151 using the adjusted fractional frequency tuning signal F+ADJ during an initial calibration mode to determine a phase at which a phase detector changes direction. The iteration can be performed in a variety of ways, including, but not limited to, using a binary search implemented using the state machine 178. In certain implementations, the phase detector is implemented using the phase difference calculation circuit 113, and can correspond to a phase at which the value of captured I samples toggles or at which the value of captured Q samples toggles.

Figure 6B:
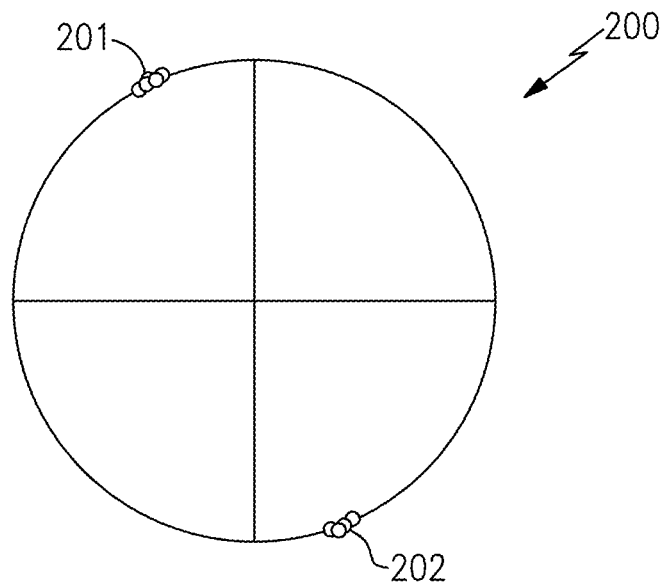
FIG. 6B is a phase graph of one example of tracking phase accumulator values sampled concurrently with local oscillator samples.

FIG. 6B is a phase graph 200 of one example of tracking phase accumulator values sampled concurrently with the local oscillator samples. The phase graph 200 includes I/Q samples 201 and I/Q samples 202 for one example of sampling I and Q tracking phase accumulator signals of a fractional-N PLL operating with a divisional value of approximately an arbitrary integer plus one-half. As shown in FIG. 6B, the samples can be relatively correlated, since the samples can repeat at about the same phase. Since the fractional word of the divider is approximately one half, the samples are clustered in two groups, I/Q samples 201 and I/Q samples 202, with no other values of the tracking phase accumulator occurring at the sample points. Since the samples are relatively correlated, averaging may not improve phase measurement accuracy.

Figure 6C:
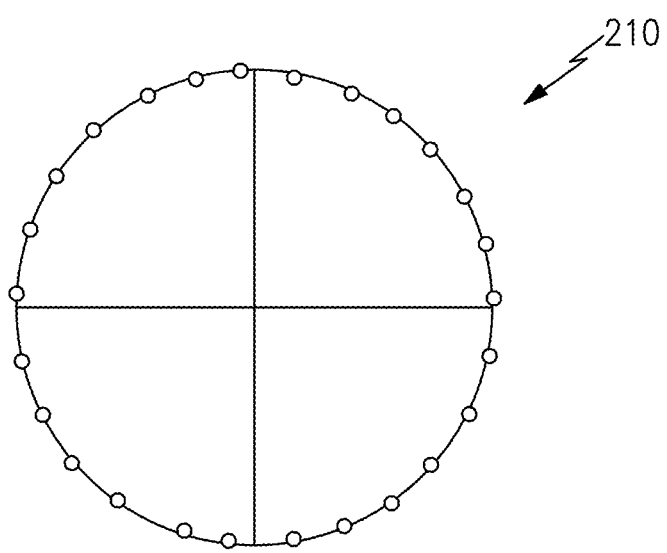
FIG. 6C is a phase graph of another example of tracking phase accumulator values sampled concurrently with local oscillator samples.

FIG. 6C is a phase graph 210 of another example of tracking phase accumulator values sampled concurrently with the local oscillator samples. The phase graph 210 includes one example of samples of tracking phase accumulator signals of a fractional-N PLL that has a frequency varied during an initial calibration mode using a calibration fractional frequency tuning signal.

In contrast to the phase graph 200 of FIG. 6B, the phase graph 210 of FIG. 6C includes samples that are relatively uncorrelated. By varying the frequency of a PLL during an initial calibration mode, the captured samples can be statistically de-correlated, which leads to the phase synchronization circuit accurately determining an amount of phase adjustment to provide to the PLL to obtain synchronization.

Figure 7:
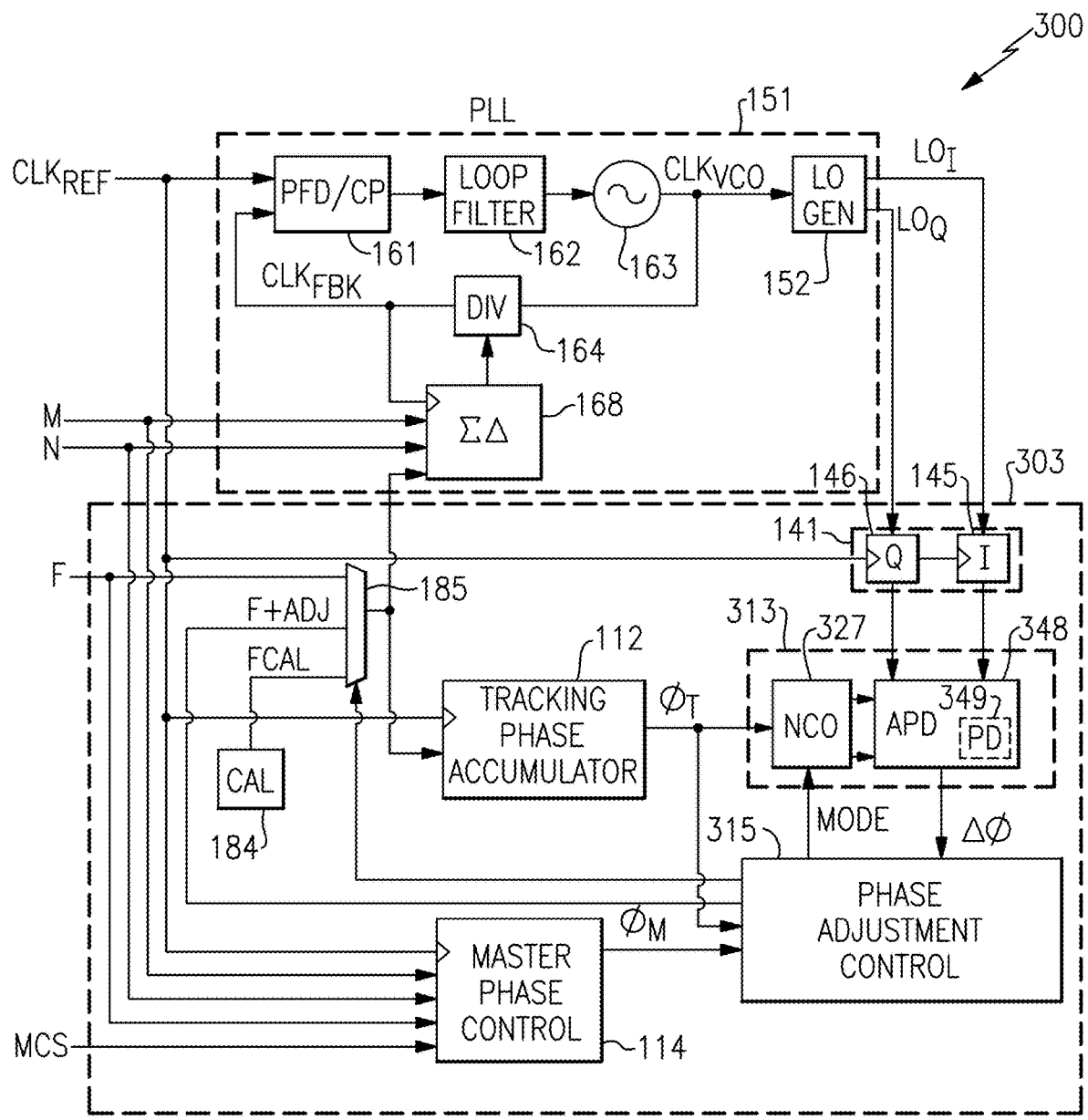
FIG. 7 is a schematic diagram of a frequency synthesizer according to another embodiment.

FIG. 7 is a schematic diagram of a frequency synthesizer 300 according to another embodiment. The frequency synthesizer 300 includes a PLL 151 and a phase synchronization circuit 303. The frequency synthesizer 300 receives a reference clock signal $CLK_{REF}$, a fractional frequency tuning signal F, a modulus signal M, an integer frequency tuning signal N, and a synchronization signal MCS.

The frequency synthesizer 300 of FIG. 7 is similar to the frequency synthesizer 180 of FIG. 6A, except that the frequency synthesizer 300 of FIG. 7 illustrates one example of a phase synchronization circuit that operable in both an initial calibration mode and in a tracking calibration mode.

For example, the illustrated phase synchronization circuit 303 includes a sampling circuit 141, a tracking phase accumulator 112, a phase difference calculation circuit 313, a master phase control circuit 114, a phase adjustment control circuit 315, a calibration circuit 184, and a multiplexer 185. The illustrated sampling circuit 141 includes an I sampler 145 and a Q sampler 146. Additionally, the illustrated phase difference calculation circuit 313 includes an NCO 327 and an accumulated phase difference (APD) calculator 348.

The illustrated phase synchronization circuit 303 is operable in an initial calibration mode in which the phase adjustment control circuit 315 controls the selection of the multiplexer 185 to vary the frequency of the PLL 151 to statistically decorrelate the samples captured by the sampling circuit 141.

After the initial phase adjustment has been completed, the phase synchronization circuit 303 is operable in a tracking calibration mode that applies relatively small phase adjustments to keep the PLL 151 aligned to the master digital phase signal $\phi_M$.

Thus, the phase synchronization circuit 303 operates in a first or initial calibration mode associated with initial phase calibration and a second or tracking calibration mode associated with tracking calibration. In the tracking calibration mode, the calibration can be a background calibration occurring during normal operation of the PLL 151, such as when the local oscillator signals $LO_I$, $LO_Q$ are being used by a transceiver for frequency conversion. Thus, during the tracking calibration mode, the phase adjustment control circuit 315 controls the multiplexer 185 to select the fractional frequency tuning signal F, which can remain constant. During the tracking calibration mode, a longer time period can be used for local oscillator signal observations, thereby allowing sufficient averaging to properly observe the PLL's output phase for near-integer settings of the PLL's division rate. In one embodiment, tracking calibration mode is performed using P samples of an output clock signal, where P is selected to be in the range of 256 samples to 8,388,608 samples.

In certain implementations, the APD calculator 348 is operated as a phase detector (PD) 349 during the tracking calibration mode. For example, during the tracking calibration mode, the phase difference calculation circuit 313 can generate the phase difference signal $\Delta\phi$ based on only one of the I sample signal or the Q sample signal in the tracking calibration mode. Additionally, the phase adjustment control circuit 315 can determine a direction of phase adjustment in the tracking calibration mode based on counting a number of positive samples and a number of negative samples of the I sample signal or the Q sample signal provided by the phase detector 349.

In certain configurations, the NCO 327 used to convert the tracking digital phase signal $\phi_T$ to an I/Q representation operates in different modes during tracking calibration relative to initial calibration. For example, the NCO 327 receives a mode signal MODE from the phase adjustment control circuit 315, which changes a resolution of the NCO 327. For example, the NCO 327 can switch from a 2-state mode in the initial calibration mode to a 3-state mode in the tracking calibration mode, thereby facilitating operation with integer divide values of the PLL 151.

Additional details of the frequency synthesizer 300 can be as described earlier.

Figure 8:
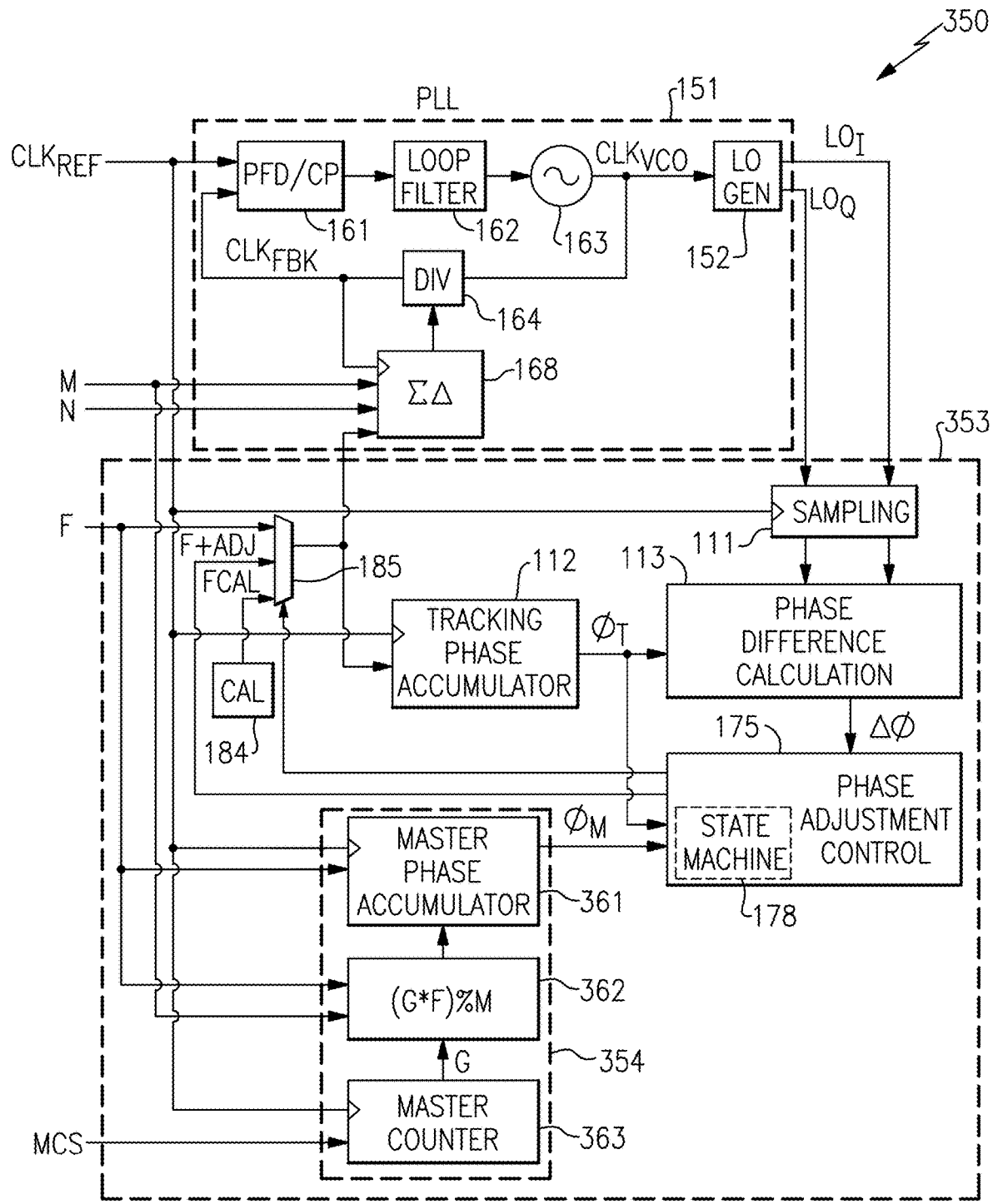
FIG. 8 is a schematic diagram of a frequency synthesizer according to another embodiment.

FIG. 8 is a schematic diagram of a frequency synthesizer 350 according to another embodiment. The frequency synthesizer 350 includes a PLL 151 and a phase synchronization circuit 353. The frequency synthesizer 350 receives a reference clock signal $CLK_{REF}$, a fractional frequency tuning signal F, a modulus signal M, an integer frequency tuning signal N, and a synchronization signal MCS.

The frequency synthesizer 350 of FIG. 8 is similar to the frequency synthesizer 180 of FIG. 6A, except that the frequency synthesizer 350 of FIG. 8 illustrates a specific implementation of a master phase control circuit.

For example, the illustrated phase synchronization circuit 353 includes a sampling circuit 111, a tracking phase accumulator 112, a phase difference calculation circuit 113, a master phase control circuit 354, a phase adjustment control circuit 175, a calibration circuit 184, and a multiplexer 185. Additionally, the illustrated master phase control circuit 354 includes a master counter 363, a master phase calculation circuit 362, and a master phase accumulator 361.

In the illustrated embodiment, the master counter 363 generates a master count signal G based on timing of the reference clock signal $CLK_{REF}$ and the synchronization signal MCS. The illustrated master counter 363 is resettable by the synchronization signal MCS, and operates as a frequency independent +1 counter that increments based on timing of the reference clock signal $CLK_{REF}$. The master counter 363 can be implemented with sufficient precision, such as 64 or more bits, to avoid wrapping during operation of the PLL 151. For example, when the reference clock signal $CLK_{REF}$ has a frequency of 80 MHZ and a 64-bit master counter is used, the master counter can run for about 7,311 years before reaching a wrapping condition.

The master phase calculation circuit 362 computes an instantaneous master phase signal based on a function (G*F) % M, where G is the master count signal, F is a value of the fractional frequency tuning signal, M is a value of the modulus signal, and % is mathematical modulo operation. Calculating the instantaneous master phase signal in this manner provides a correct value of the master digital phase signal $\phi_M$ even when a synchronization sequence via the synchronization signal MCS occurs before the fractional frequency tuning signal F, the modulus signal M, and/or the integer frequency tuning signal N are controlled to their desired values.

In the illustrated embodiment, the master phase control circuit 354 also includes the master phase accumulator 361, which is initialized using the instantaneous master phase signal generated by the master phase calculation circuit 362. Additionally, the master phase accumulator 361 updates the master digital phase signal $\phi_M$ based on the fractional frequency tuning signal F and timing of the reference clock signal $CLK_{REF}$.

Including the master phase accumulator 361 can reduce computations by allowing an instantaneous master phase signal to be initially calculated and thereafter updated via the master phase accumulator 361. However, in other implementations, the master phase accumulator is omitted. For example, the master digital phase signal $\phi_M$ can be generated each cycle of the reference clock signal $CLK_{REF}$ using the master phase calculation circuit 362.

As shown in FIG. 8, the master phase control circuit 354 generates the master digital phase signal $\phi_M$ based on the unmodified fractional frequency tuning signal F, while the tracking phase accumulator 112 operates using the fractional frequency tuning signal that is selected by the multiplexer 185. Implementing the phase synchronization circuit 353 in this manner allows the master digital phase signal $\phi_M$ to remain globally constant in a multi-PLL implementation, while the tracking digital phase signal $\phi_T$ of a particular PLL tracks that PLL's phase.

Thus, in a multi-transceiver/multi-PLL implementation, each PLL can include a master counter that can be reset via the synchronization signal MCS. The master counter of each synchronized transceiver can have the same value at a given time. Additionally, whenever a phase calibration is initiated, the master digital phase signal $\phi_M$ can be computed from the master count signal G such that each transceiver operates with a synchronized phase.

Additional details of the frequency synthesizer 350 can be as described earlier.

Figure 9:
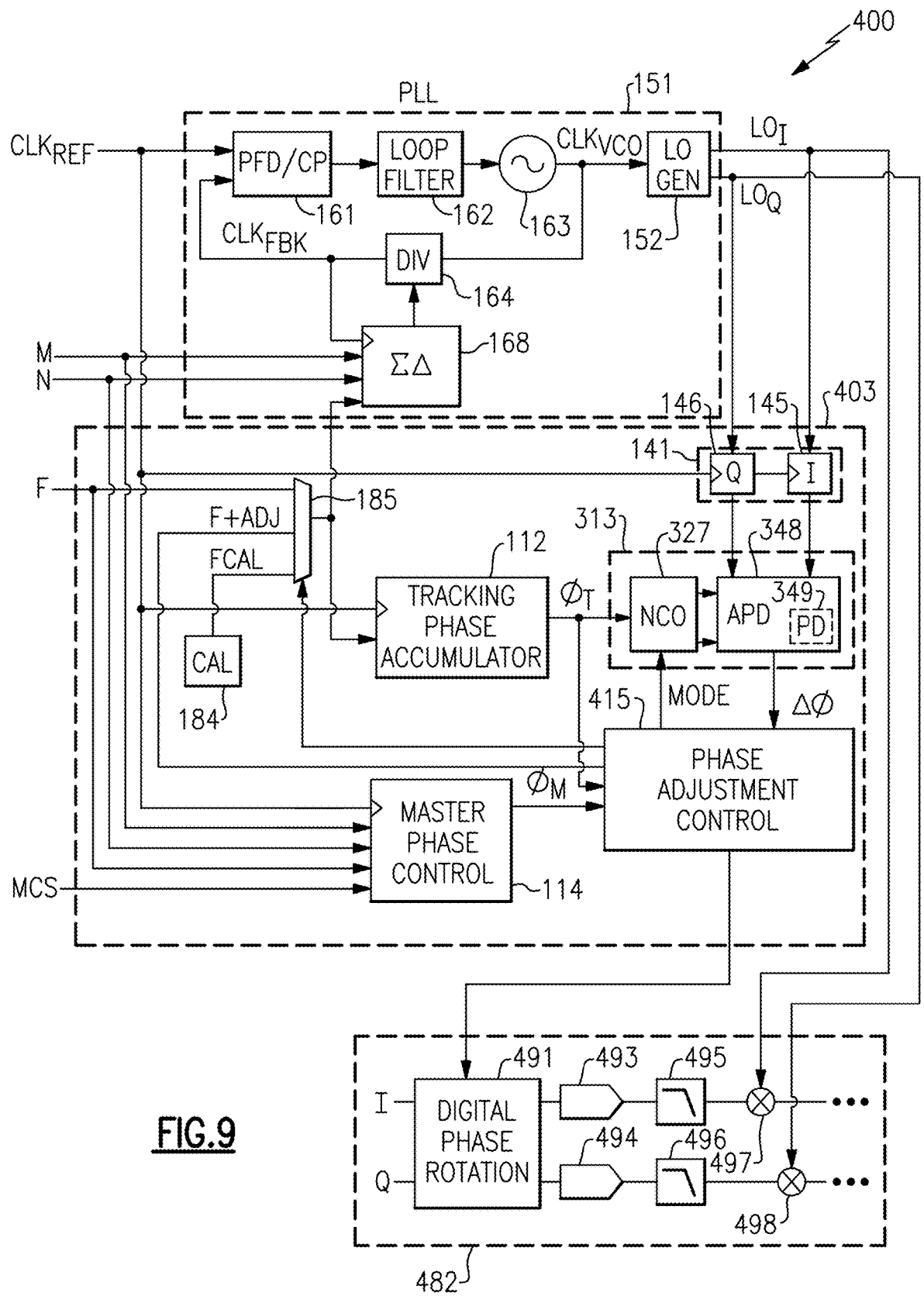
FIG. 9 is a schematic diagram of an RF communication system according to another embodiment.

FIG. 9 is a schematic diagram of an RF communication system 400 according to another embodiment. The RF communication system 400 includes a transceiver circuit 482 and a frequency synthesizer that includes a PLL 151 and a phase synchronization circuit 403.

The phase synchronization circuit 403 of FIG. 9 is similar to the phase synchronization circuit 303 of FIG. 7. For example, the phase synchronization circuit 403 includes similar circuitry, and is operable in an initial calibration mode and in a tracking calibration mode.

However, in the embodiment of FIG. 9, the phase synchronization circuit 403 includes a phase adjustment control circuit 415 that controls a digital phase rotation of the transceiver circuit 482 during the tracking calibration mode. In particular, during the tracking calibration mode, samples can be relatively correlated and occur at similar positions or points in a phase graph. In one example, I and Q samples taken during the tracking calibration mode can be similar to those shown earlier with respect to the phase graph 600 of FIG. 6B.

By allowing the phase synchronization circuit 403 to control an amount of digital phase rotation of the transceiver circuit 482, the phase synchronization circuit 403 can shift or rotate the sampling instances of the local oscillator signal $LO_I$, $LO_Q$ to a desirable position of the phase graph, such as near a 0° to 360° phase transition point.

For example, the illustrated transceiver circuit 482 includes an I-path, a Q-path, and a digital phase rotation circuit 491 that controls a digital phase rotation of the I-path and the Q-path. The illustrated I-path includes an I-path data converter 493, an I-path filter 495, and an I-path mixer 497, and the illustrated Q-path includes a Q-path data converter 494, a Q-path filter 496, and a Q-path mixer 498. However, other implementations of transceiver circuits are possible.

As shown in FIG. 9, the I local oscillator signal $LO_I$ from the PLL 151 is provided to the I-path mixer 497, and the Q local oscillator signal $LO_Q$ from the PLL 151 is provided to the Q-path mixer 498. A total phase of an I signal component is based on a combination of the phase of the I local oscillator signal $LO_I$ and the phase of the digital phase rotation circuit 491. Additionally, a total phase of a Q signal component is based on a combination of the phase of the Q local oscillator signal $LO_Q$ and the phase of the digital phase rotation circuit 491.

By allowing the phase synchronization circuit 403 to provide a total phase adjustment based on a sum of the phase adjustment provided to the PLL 151 and the phase adjustment provided by the digital phase rotation circuit 491, the phase synchronization circuit 403 has the flexibility to rotate the position of I and Q samples in a phase graph. Accordingly, during the tracking calibration mode, the phase synchronization circuit 403 can rotate the sampling instances of the local oscillator signal $LO_I$, $LO_Q$ to a desirable position, such as near a 0° to 360° phase transition point.

Additional details of the RF communication system 400 can be similar to those described earlier.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A frequency synthesizer system with phase synchronization, the frequency synthesizer system comprising:
   a fractional-N phase-locked loop (PLL) configured to receive a reference clock signal at an input and to generate an output clock signal at an output, the fractional-N PLL including an input phase detector configured to compare the reference clock signal to a feedback clock signal; and
   a phase synchronization circuit comprising:
      an output phase detector configured to generate an output phase detection signal based on comparing the output clock signal to the reference clock signal used by the input phase detector of the fractional-N PLL; and
      a phase adjustment control circuit configured to generate a phase adjustment signal based on accumulating the output phase detection signal,
   wherein the phase synchronization circuit is configured to provide a phase adjustment to the fractional-N PLL based on the phase adjustment signal so as to synchronize the fractional-N PLL.

2. The frequency synthesizer system of claim 1, wherein the fractional-N PLL receives the phase adjustment signal at a control input, wherein the phase synchronization circuit operates as a digital slow loop between the output of the fractional-N PLL and the control input to the fractional-N PLL.

3. The frequency synthesizer system of claim 1, wherein the phase adjustment control circuit provides the phase adjustment to the fractional-N PLL in increments over a plurality of cycles of the reference clock signal.

4. The frequency synthesizer system of claim 1, wherein the phase adjustment signal is a multi-bit digital signal.

5. The frequency synthesizer system of claim 1, wherein the fractional-N PLL comprises a divider configured to generate the feedback clock signal and a modulator configured to control a division rate of the divider, wherein the phase synchronization circuit is configured to apply a phase offset to the modulator based on the phase adjustment signal.

6. The frequency synthesizer system of claim 1, further comprising a mixer configured to receive the output clock signal.

7. The frequency synthesizer system of claim 1, wherein the feedback clock signal is divided in frequency relative to the output clock signal.

8. A method of phase synchronization in a frequency synthesizer, the method comprising:
   generating an output clock signal based on a reference clock signal using a fractional-N phase-locked loop (PLL), including comparing the reference clock signal to a feedback clock signal using an input phase detector;
   generating an output phase detection signal based on comparing the output clock signal to the reference clock signal of the input phase detector using an output phase detector;
   accumulating the output phase detection signal to generate a phase adjustment signal; and
   synchronizing the fractional-N PLL by providing a phase adjustment to the fractional-N PLL using the phase adjustment signal.

9. The method of claim 8, wherein synchronizing the fractional-N PLL comprises providing the phase adjustment to the fractional-N PLL in increments over a plurality of cycles of the reference clock signal.

10. The method of claim 8, wherein synchronizing the fractional-N PLL includes controlling the fractional-N PLL with a multi-bit digital signal.

11. The method of claim 8, further comprising generating the feedback signal using a divider of the fractional-N PLL, and controlling a division rate of the divider using a modulator of the fractional-N PLL.

12. The method of claim 11, wherein synchronizing the fractional-N PLL by providing the phase adjustment comprises applying a phase offset to the modulator based on the phase adjustment signal.

13. The method of claim 11, further comprising performing mixing using the output clock signal.

14. A beamforming system with phase synchronization, the beamforming system comprising:
   a plurality of mixers configured to receive a plurality of local oscillator signals; and
   a plurality of frequency synthesizers configured to generate the plurality of local oscillator signals based on timing of a common reference clock signal, wherein a first frequency synthesizer of the plurality of frequency synthesizers comprises:

a fractional-N phase-locked loop (PLL) configured to receive the common reference clock signal at an input and to generate a first local oscillator signal of the plurality of local oscillator signals at an output, the fractional-N PLL including an input phase detector configured to receive the common reference clock signal; and a phase synchronization circuit configured to generate an output phase detection signal based on comparing the first local oscillator signal to the common reference clock signal used by the input phase detector of the fractional-N PLL, and to generate a phase adjustment signal based on accumulating the output phase detection signal, wherein the phase synchronization circuit is configured to provide a phase adjustment to the fractional-N PLL based on the phase adjustment signal so as to synchronize the fractional-N PLL.

15. The beamforming system of claim 14, further comprising a plurality of antennas coupled to the plurality of mixers.

16. The beamforming system of claim 14, wherein the fractional-N PLL receives the phase adjustment signal at a control input, wherein the phase synchronization circuit operates as a digital slow loop between the output of the fractional-N PLL and the control input to the fractional-N PLL.

17. The beamforming system of claim 14, wherein the phase adjustment control circuit provides the phase adjustment to the fractional-N PLL in increments over a plurality of cycles of the common reference clock signal.

18. The beamforming system of claim 14, wherein the phase adjustment signal is a multi-bit digital signal.

19. The beamforming system of claim 14, wherein the fractional-N PLL comprises a modulator configured to control a division rate of the fractional-N PLL, wherein the phase adjustment signal is operable to control a phase offset to the modulator.

20. The beamforming system of claim 14, wherein the fractional-N PLL comprises a divider configured to generate a feedback clock signal that is divided in frequency relative to the output clock signal, wherein the input phase detector is configured to compare the reference clock signal to the feedback clock signal.

21. The frequency synthesizer system of claim 1, wherein the output phase detector detects a phase difference between the output clock signal and the reference clock signal, and a frequency of the output clock signal is related to a frequency of the reference clock signal by a fractional divisional value.

* * * * *